(12) United States Patent
Morikawa et al.

(10) Patent No.: US 11,532,492 B2
(45) Date of Patent: Dec. 20, 2022

(54) SUBSTRATE PROCESSING APPARATUS AND SUBSTRATE PROCESSING METHOD

(71) Applicant: Tokyo Electron Limited, Tokyo (JP)

(72) Inventors: Katsuhiro Morikawa, Koshi (JP); Masami Akimoto, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 128 days.

(21) Appl. No.: 16/830,371

(22) Filed: Mar. 26, 2020

(65) Prior Publication Data

US 2020/0312678 A1 Oct. 1, 2020

(30) Foreign Application Priority Data

Mar. 28, 2019 (JP) .............................. JP2019-063371

(51) Int. Cl.
| | |
|---|---|
| *H01L 21/677* | (2006.01) |
| *H01L 21/67* | (2006.01) |
| *H01L 21/306* | (2006.01) |
| *H01L 21/687* | (2006.01) |

(52) U.S. Cl.
CPC .... *H01L 21/6708* (2013.01); *H01L 21/30604* (2013.01); *H01L 21/67103* (2013.01); *H01L 21/67173* (2013.01); *H01L 21/67742* (2013.01); *H01L 21/687* (2013.01)

(58) Field of Classification Search
None
See application file for complete search history.

(56) References Cited

U.S. PATENT DOCUMENTS

| | | | | |
|---|---|---|---|---|
| 4,228,358 A | * | 10/1980 | Ryding | H01J 37/3171 250/492.2 |
| 8,991,329 B1 | * | 3/2015 | Park | H01L 21/3081 118/500 |
| 9,263,308 B2 | * | 2/2016 | Lei | H01L 21/67207 |
| 11,148,179 B2 | * | 10/2021 | Nagakubo | H01L 21/67248 |
| 2005/0113976 A1 | * | 5/2005 | van der Meulen | H01L 21/6719 700/245 |
| 2006/0130751 A1 | * | 6/2006 | Volfovski | H01L 21/67173 118/300 |

(Continued)

FOREIGN PATENT DOCUMENTS

JP 2014-157936 A 8/2014

*Primary Examiner* — Jarrett J Stark
(74) *Attorney, Agent, or Firm* — Pearne & Gordon LLP

(57) ABSTRACT

A substrate processing apparatus includes a liquid processing module, including a carry-out/in port of a substrate, in which a first liquid processing device and a second liquid processing device provided at a position farther from the carry-out/in port than the first liquid processing device is are provided; and a transfer device configured to carry the substrate out from and into the liquid processing module. The first liquid processing device performs a first liquid processing on the substrate. The second liquid processing device performs a second liquid processing on the substrate before or after the first liquid processing. The transfer device includes a substrate holder configured to be moved back and forth in a first horizontal direction, and carries the non-processed substrate into the first liquid processing device through the carry-out/in port and carries the processed substrate out from the first liquid processing device through the carry-out/in port.

15 Claims, 25 Drawing Sheets

(56) References Cited

U.S. PATENT DOCUMENTS

| | | | |
|---|---|---|---|
| 2006/0134340 A1* | 6/2006 | Ishikawa | H01L 21/67178 118/52 |
| 2007/0269297 A1* | 11/2007 | Meulen | H01L 21/67748 414/222.01 |
| 2008/0006650 A1* | 1/2008 | Tseng | G05D 16/202 222/1 |
| 2011/0076117 A1* | 3/2011 | Iizuka | H01L 21/67754 414/217 |
| 2012/0312336 A1* | 12/2012 | Itoh | H01L 21/6708 134/36 |
| 2015/0076371 A1* | 3/2015 | Huang | H01J 37/3174 250/492.21 |
| 2017/0125269 A1* | 5/2017 | Dunham | H01L 21/67196 |
| 2017/0253968 A1* | 9/2017 | Yahata | C23C 16/4408 |
| 2017/0266700 A1* | 9/2017 | Nagakubo | H01L 21/67248 |
| 2018/0286729 A1* | 10/2018 | Kawabe | H01L 21/67017 |
| 2020/0024726 A1* | 1/2020 | Moradian | C23C 14/562 |
| 2020/0098602 A1* | 3/2020 | Inagaki | H01L 21/67745 |
| 2020/0111693 A1* | 4/2020 | Kiyama | H01L 21/67173 |
| 2020/0211882 A1* | 7/2020 | Kuwahara | H01L 21/67769 |
| 2020/0219736 A1* | 7/2020 | Aoki | H01L 21/67748 |
| 2020/0312678 A1* | 10/2020 | Morikawa | H01L 21/30604 |
| 2021/0013067 A1* | 1/2021 | Carlson | H01L 21/68707 |
| 2021/0057251 A1* | 2/2021 | Matsuoka | H01L 21/67742 |
| 2021/0242052 A1* | 8/2021 | Komiyaji | H01L 21/67742 |
| 2021/0253365 A1* | 8/2021 | Kodama | H01L 21/67742 |

\* cited by examiner

SUBSTRATE PROCESSING APPARATUS AND SUBSTRATE PROCESSING METHOD

CROSS-REFERENCE TO RELATED APPLICATION

This application claims the benefit of Japanese Patent Application No. 2019-063371 filed on Mar. 28, 2019, the entire disclosures of which are incorporated herein by reference.

TECHNICAL FIELD

The exemplary embodiments described herein pertain generally to a substrate processing apparatus and a substrate processing method.

BACKGROUND

In manufacturing of a semiconductor device, a liquid processing using various chemical liquids is performed on a substrate such as a semiconductor wafer W or the like. Particularly, Patent Document 1 discloses a substrate processing apparatus that performs a series of processes including: supplying a phosphoric acid aqueous solution onto a substrate being rotated; forming a puddle of the phosphoric acid aqueous solution on the substrate while the rotation of the substrate is stopped or the substrate is rotated at a low speed; heating the puddle of the phosphoric acid aqueous solution with an infrared heater to promote etching with the phosphoric acid aqueous solution; rinsing the substrate being rotated with deionized water; chemical liquid cleaning of the substrate being rotated with SC1; rinsing the substrate being rotated with deionized water; and scattering and drying. The substrate processing apparatus performs the series of processes while the substrate is kept held on a single spin chuck.

Patent Document 1: Japanese Patent Laid-open Publication No. 2014-15936

SUMMARY

According to one exemplary embodiment, a substrate processing apparatus includes a liquid processing module, including a carry-out/in port of a substrate, in which a first liquid processing device and a second liquid processing device provided at a position farther from the carry-out/in port than the first liquid processing device is are provided; and a transfer device configured to carry the substrate out from and into the liquid processing module. The first liquid processing device is equipped with a first holder configured to hold the substrate and configured to perform a first liquid processing on the substrate held by the first holder. The second liquid processing device is equipped with a second holder configured to hold the substrate and configured to perform a second liquid processing on the substrate held by the second holder before or after the first liquid processing. The transfer device is equipped with a substrate holder configured to be moved back and forth in a first horizontal direction, and is configured to carry the substrate, which is to be processed in the first liquid processing device and the second liquid processing device, into the first liquid processing device through the carry-out/in port and carry the substrate, which is processed in the first liquid processing device and the second liquid processing device, out from the first liquid processing device through the carry-out/in port by moving the substrate held by the substrate holder back and forth in the first horizontal direction.

The foregoing summary is illustrative only and is not intended to be in any way limiting. In addition to the illustrative aspects, exemplary embodiments, and features described above, further aspects, exemplary embodiments, and features will become apparent by reference to the drawings and the following detailed description.

BRIEF DESCRIPTION OF THE DRAWINGS

In the detailed description that follows, exemplary embodiments are described as illustrations only since various changes and modifications will become apparent to those skilled in the art from the following detailed description. The use of the same reference numbers in different figures indicates similar or identical items.

DETAILED DESCRIPTION

Figure 1:
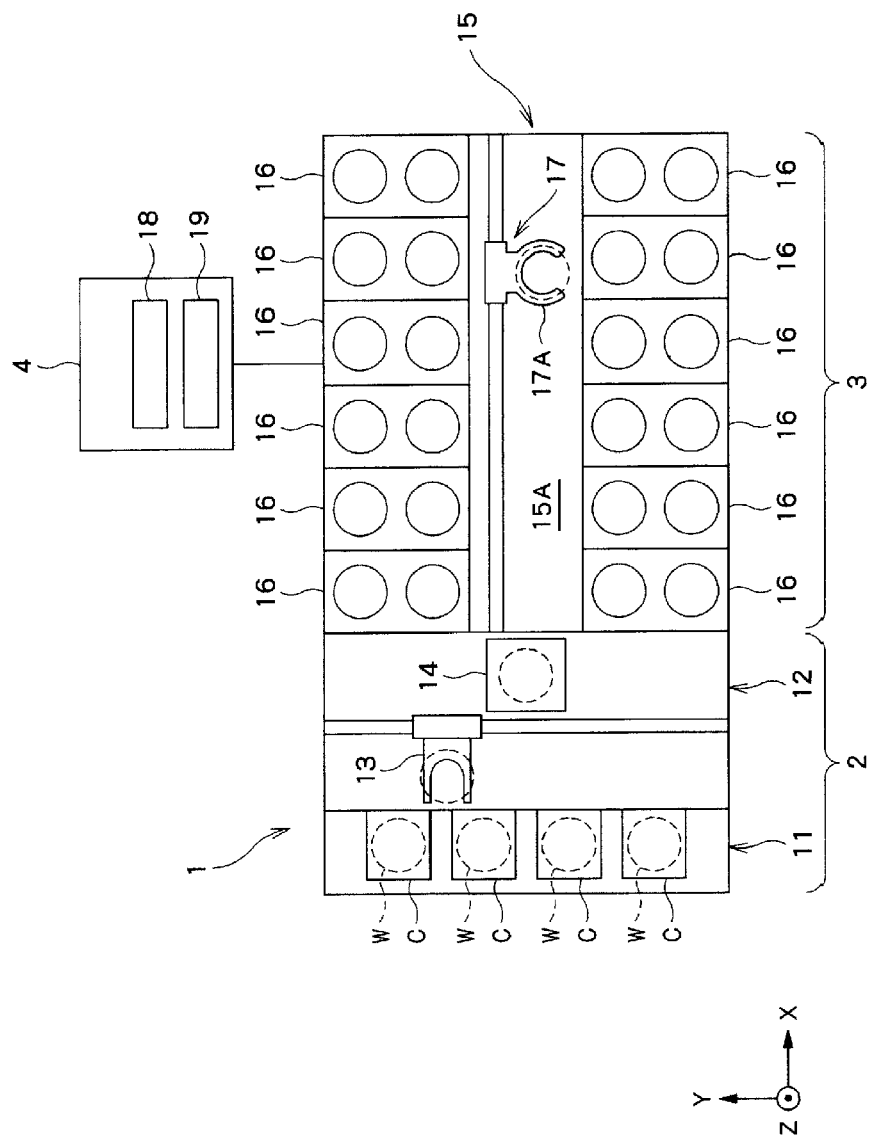
FIG. 1 is a schematic plan view illustrating an entire configuration of a substrate processing system according to an exemplary embodiment of a substrate processing apparatus.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other exemplary embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

A substrate processing system according to an exemplary embodiment of a substrate processing apparatus will be described with reference to the accompanying drawings. FIG. 1 illustrates a schematic configuration of the substrate processing system according to the present exemplary embodiment. In the following, in order to clarify positional relationships, the X-axis, Y-axis and Z-axis which are orthogonal to each other will be defined, and the positive Z-axis direction will be regarded as a vertically upward direction.

As illustrated in FIG. 1, a substrate processing system 1 includes a carry-in/out station 2 and a processing station 3. The carry-in/out station 2 and the processing station 3 are provided adjacent to each other.

The carry-in/out station 2 is equipped with a carrier placing section 11 and a transfer section 12. In the carrier placing section 11, a plurality of carriers C is placed to accommodate a plurality of substrates, e.g., semiconductor wafers in the present exemplary embodiment (hereinafter, referred to as "wafers W"), horizontally.

The transfer section 12 is provided adjacent to the carrier placing section 11 and equipped with a substrate transfer device 13 and a delivery unit 14. The substrate transfer device 13 is equipped with a wafer holding mechanism configured to hold a wafer W. Further, the substrate transfer device 13 is movable in a Y-axis direction (first horizontal direction) and a Z-axis direction (vertical direction) and rotatable around a vertical axis, and transfers the wafer W between the carriers C and the delivery unit 14 by using the wafer holding mechanism.

The processing station 3 is provided adjacent to the transfer section 12. The processing station 3 is equipped with a transfer section 15 and a plurality of liquid processing modules 16. The plurality of liquid processing modules 16 is arranged on both sides of the transfer section 15 in an X-axis direction (second horizontal direction).

The transfer section 15 is equipped with a transfer path 15A extending in the X-axis direction (second horizontal direction) and a substrate transfer device (transfer device) 17 provided in the transfer path 15A. The substrate transfer device 17 is equipped with a wafer holding mechanism configured to hold a wafer W. Further, the substrate transfer device 17 is movable in the second horizontal direction (X-axis direction) and the vertical direction (Z-axis direction) and rotatable around a vertical axis. The substrate transfer device 17 is equipped with a transfer arm 17A configured to hold a wafer W and transfers the wafer W between the delivery unit 14 and any one of the liquid processing modules 16 by using the transfer arm 17A.

The liquid processing module 16 performs a predetermined liquid processing on the wafer W transferred by the substrate transfer device 17 (described in detail below).

Further, the substrate processing system 1 is equipped with a control device 4. The control device 4 is, for example, a computer and includes a controller 18 and a storage 19. The storage 19 stores a program that controls various processings performed in the substrate processing system 1. The controller 18 controls the operations of the substrate processing system 1 by reading and executing the program stored in the storage 19.

Furthermore, the program may be recorded in a computer-readable recording medium and installed from the recording medium to the storage 19 of the control device 4. The computer-readable recording medium includes, for example, a hard disk (HD), a flexible disk (FD), a compact disk (CD), a magneto-optical disk (MO), and a memory card.

In the substrate processing system 1 configured as described above, the substrate transfer device 13 of the carry-in/out station 2 first takes out a wafer W from a carrier C placed in the carrier placing section 11 and then places the wafer W on the delivery unit 14. The wafer W placed on the delivery unit 14 is taken out from the delivery unit 14 by the substrate transfer device 17 of the processing station 3 and carried into a liquid processing module 16.

The wafer W carried into the liquid processing module 16 is processed by the liquid processing module 16 and then carried out from the corresponding liquid processing module 16 and placed on the delivery unit 14 by the substrate transfer device 17. After processed and placed on the delivery unit 14, the wafer W is returned to the carrier C of the carrier placing section 11 by the substrate transfer device 13.

Figure 2:
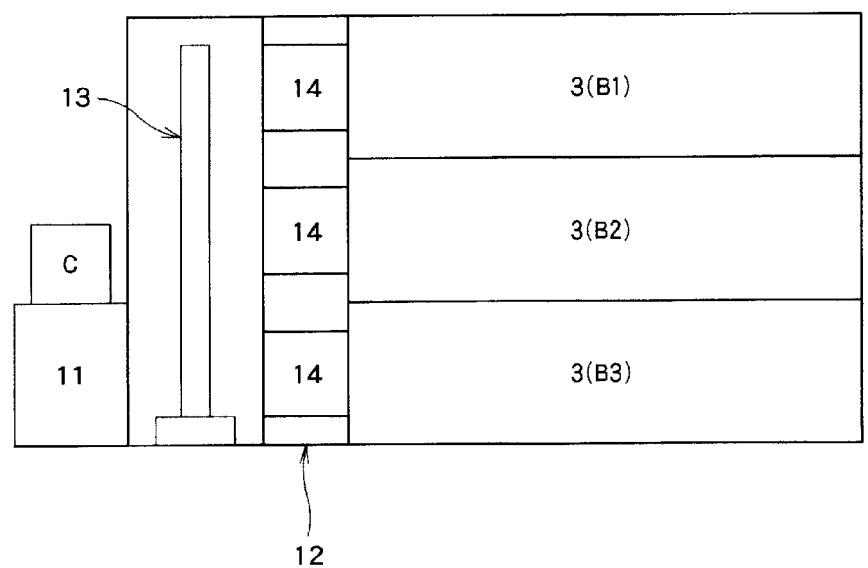
FIG. 2 is a schematic side view illustrating an entire configuration of a substrate processing system according to another exemplary embodiment.

In the exemplary embodiment, as illustrated in FIG. 2, the processing station 3 can be configured by stacking a plurality of unit blocks B1, B2 and B3. Each of the unit blocks B1 to B3 has the same configuration as the processing station 3 illustrated in FIG. 1. In this case, a plurality of delivery units 14 is provided and each of the delivery units 14 is assigned to the corresponding unit block. The substrate transfer device 13 of the carry-in/out station 2 can transfer a wafer W between the carrier C and any one of the delivery units 14.

Hereinafter, a configuration of the liquid processing module 16 will be described mainly with reference to FIG. 3 and FIG. 4. The liquid processing module 16 has a housing 1601 covering the entire liquid processing module 16. In the housing 1601, a first liquid processing device 1000 and a second liquid processing device 2000 arranged linearly in the Y-axis direction are provided. The first liquid processing device 1000 is configured to perform a first liquid processing including a series of processes on a wafer W, and the second liquid processing device 2000 is configured to perform a second liquid processing including a series of processes on the wafer W.

The housing 1601 has, at the side of the first liquid processing device 1000, only one carry-out/in port 1602 configured to allow a non-processed wafer W to be carried into the liquid processing module 16 and a processed wafer W to be carried out from the liquid processing module 16. The carry-out/in port 1602 is equipped with a shutter 1603 for opening/closing the carry-out/in port 1602. The transfer arm (substrate holder) 17A of the substrate transfer device (transfer device) 17 on which a wafer W is held can move in the Y-axis direction and enter into the first liquid processing device 1000 through the carry-out/in port 1602.

The first liquid processing device 1000 is equipped with a first rotational liquid processing unit 1001. The first rotational liquid processing unit 1001 is equipped with a first spin chuck 1002 (first holder) configured to hold a wafer W. The first spin chuck 1002 can hold the wafer W horizontally and rotate the wafer W held thereon around a vertical axis line 1003.

The first spin chuck 1002 is configured as a mechanical chuck. The mechanical chuck is configured to hold a wafer W by gripping a periphery of the wafer W with a plurality of grip claws including at least one movable grip claw, as known in the field of semiconductor manufacturing apparatus.

The first spin chuck 1002 is equipped with a plurality of, e.g., three, lift pins (first supporting pins) 1004. The lift pins 1004 can move up and down while supporting a rear surface (bottom surface) of the wafer W thereon.

The second liquid processing device 2000 is equipped with a second rotational liquid processing unit 2001. The second rotational liquid processing unit 2001 is equipped with a second spin chuck 2002 (second holder) configured to hold a wafer W. The second spin chuck 2002 is configured to hold the wafer W horizontally and rotate the wafer W held thereon around a vertical axis line 2003.

The second spin chuck 2002 is configured as a vacuum chuck. The vacuum chuck is configured to hold a wafer W horizontally by vacuum-suctioning a rear surface of the wafer W. The second spin chuck 2002 illustrated in FIG. 3 corresponds to a rotatable table 100 illustrated in FIG. 6 (described in detail below).

The second spin chuck 2002 is equipped with a plurality of, e.g., three, lift pins (second supporting pins) 2004. The lift pins 2004 can move up and down while supporting a rear surface (bottom surface) of the wafer W thereon. The lift pins 2004 illustrated in FIG. 3 correspond to lift pins 211 illustrated in FIG. 6.

The liquid processing module 16 is equipped with an exchange device 3000 configured to exchange substrates between the first liquid processing device 1000 and the second liquid processing device 2000. In the illustrated exemplary embodiment, the exchange device 3000 is equipped with a first arm 3100 and a second arm 3200 provided between the first liquid processing device 1000 and the second liquid processing device 2000.

The first arm 3100 is provided at a base 3101 equipped with a non-illustrated rotary actuator therein and rotatable around a vertical (Z-axis directional) rotation axis line 3102 in a horizontal plane. A vacuum chuck 3103 is provided at a front end of the first arm 3100. By rotating the first arm 3100, a center of the vacuum chuck 3103, i.e., a center of the wafer W held on the vacuum chuck 3103, can be located at a first delivery position where it coincides with the vertical axis line 1003 of the first spin chuck 1002 and a second delivery position where it coincides with the vertical axis line 2003 of the second spin chuck 2002.

The second arm 3200 is also provided at a base 3201 equipped with a non-illustrated rotary actuator therein and rotatable around a vertical (Z-axis directional) rotation axis line 3202 in a horizontal plane. A vacuum chuck 3203 is provided at a front end of the second arm 3200. By rotating the second arm 3200, a center of the vacuum chuck 3203, i.e., a center of the wafer W held on the vacuum chuck 3203, can be located at a first delivery position where it coincides with the vertical axis line 1003 of the first spin chuck 1002 and a second delivery position where it coincides with the vertical axis line 2003 of the second spin chuck 2002.

The first arm 3100 and the second arm 3200 are located at different height positions. Thus, even when the first arm 3100 and the second arm 3200 are simultaneously moved in any ways, they do not interfere with each other. In the illustrated exemplary embodiment, the first arm 3100 is located at a lower position than the second arm 3200.

Figure 4:
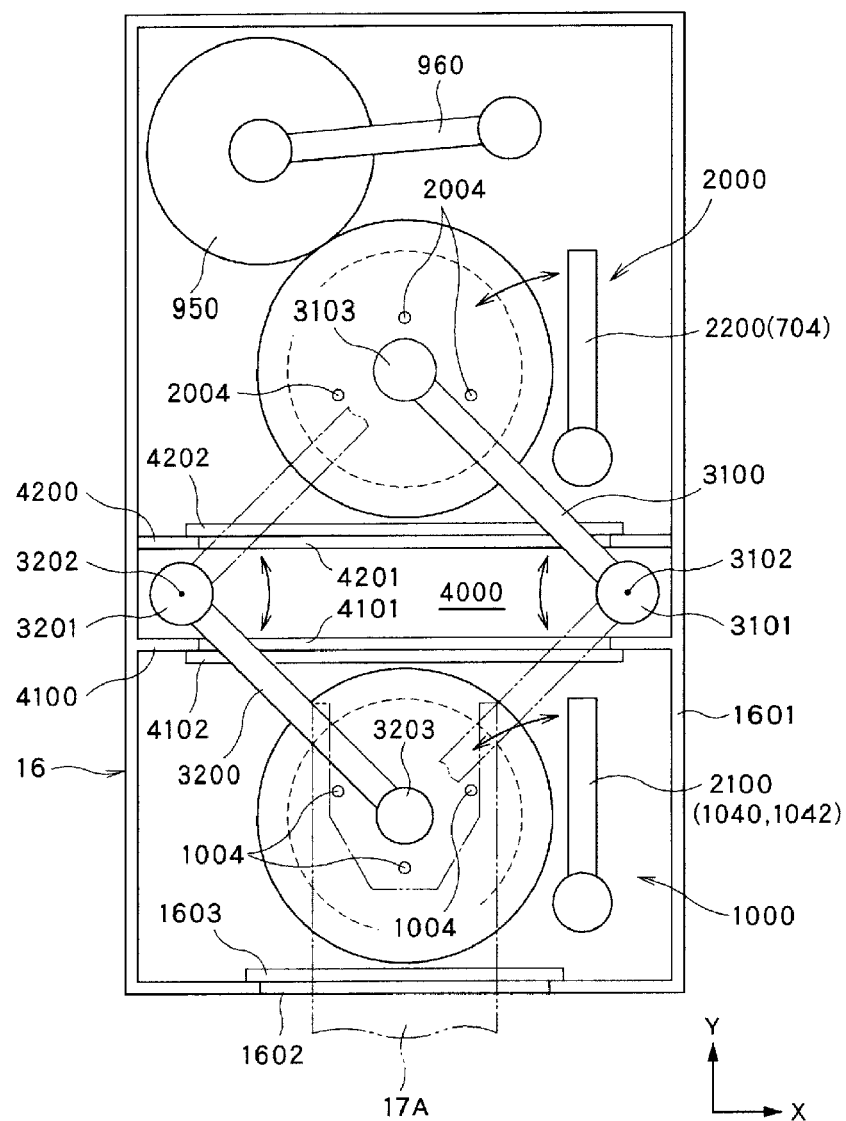
FIG. 4 is a schematic plan view of the liquid processing module illustrated in FIG. 3.

As can be understood from FIG. 4, the lift pins 1004 of the first holder 1002 are provided at any position where the lift pins 1004 do not interfere with a rotation trajectory of the first arm 3100 and the second arm 3200 at any height position. Likewise, the lift pins 2004 of the second holder 2002 are provided at any position where the lift pins 2004 do not interfere with a rotation trajectory of the first arm 3100 and the second arm 3200 at any height position. Also, the lift pins 1004 of the first holder 1002 are provided at a position where the lift pins 1004 do not interfere with a movement trajectory of the transfer arm 17A (having a horseshoe shape or a two-legged fork) that has entered into the first liquid processing device 1000 to carry the wafer W out from and into the first liquid processing device 1000.

At least one partition wall, e.g., two partition walls 4100 and 4200 in the illustrated exemplary embodiment, are provided between the first liquid processing device 1000 and the second liquid processing device 2000. The partition walls 4100 and 4200 can isolate an atmosphere inside the first liquid processing device 1000 from an atmosphere inside the second liquid processing device 2000.

The partition wall 4100 is equipped with an opening 4101, and the opening 4101 is equipped with a shutter 4102 for opening/closing the opening 4101. Likewise, the partition wall 4200 is equipped with an opening 4201, and the opening 4201 is equipped with a shutter 4202 for opening/closing the opening 4201. By opening the shutters 4102 and 4202, the first arm 3100 and the second arm 3200 each holding the wafer W thereon can be moved between the first delivery position and the second delivery position through the openings 4101 and 4201, respectively.

An arm standby space 4000 is formed between the partition wall 4100 and the partition wall 4200. The base 3101 for the first arm 3100 and the base 3201 for the second arm 3200 are placed on both ends in the X-axis direction within the arm standby space 4000.

By closing the shutters 4102 and 4202 in a state where longitudinal directions of the first arm 3100 and the second arm 3200 are made coincide with the X-axis direction, the first arm 3100 and the second arm 3200 can be accommodated entirely in the arm standby space 4000. In this case, the first arm 3100 and the second arm 3200 are isolated from both the atmosphere inside the first liquid processing device 1000 and the atmosphere inside the second liquid processing device 2000.

Within the first liquid processing device 1000, a nozzle arm 2100 having one or more nozzles for supplying, on the wafer W, processing fluids (chemical liquid, rinse liquid, drying liquid, drying gas, etc.) required for processings to be performed in the first liquid processing device 1000 is provided. Likewise, within the second liquid processing device 2000, a nozzle arm 2200 having one or more nozzles for supplying, on the wafer W, processing fluids (chemical liquid, rinse liquid, drying liquid, drying gas, etc.) required for processings to be performed in the second liquid processing device 2000 is provided.

Figure 5:
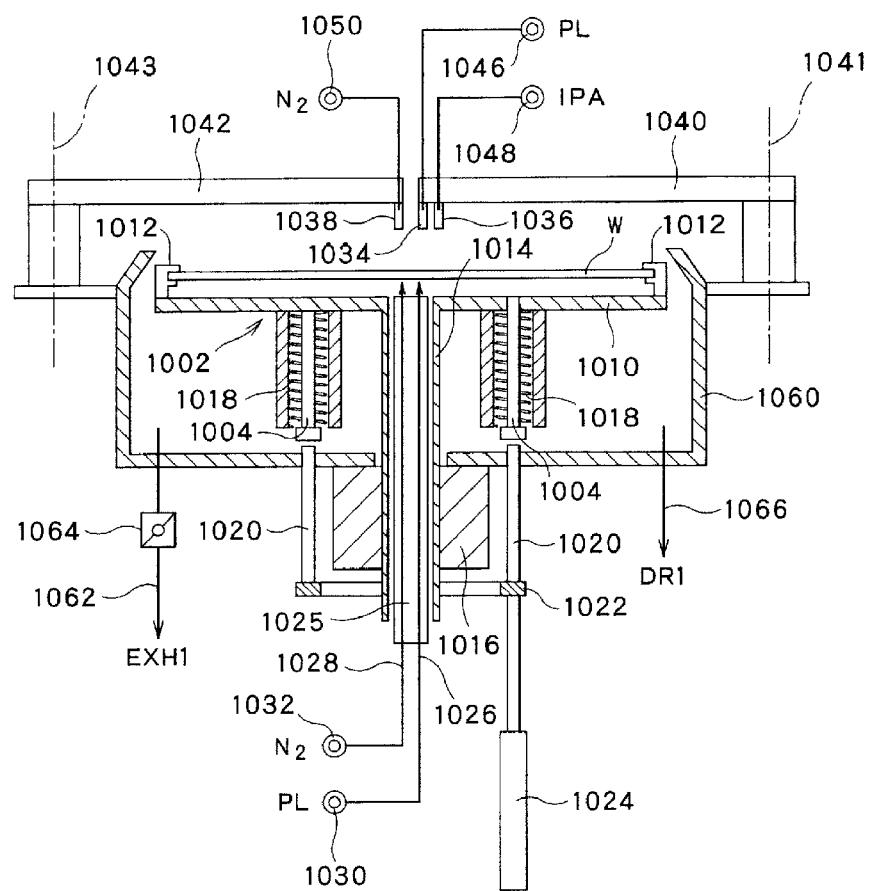
FIG. 5 is a schematic longitudinal cross-sectional view illustrating a configuration of a first liquid processing device of the liquid processing module illustrated in FIG. 3.

Hereinafter, a configuration of the first rotational liquid processing unit 1001 of the first liquid processing device 1000 will be described. The configuration of the first rotational liquid processing unit 1001 is well known in the art and thus will be described briefly with reference to the schematic diagram in FIG. 5.

As described above, the first rotational liquid processing unit 1001 is equipped with the first spin chuck 1002 (first holder). The first spin chuck 1002 is equipped with a circular plate-shaped base plate 1010 and a plurality of movable grip claws 1012 provided apart from each other in a circumferential direction on a peripheral portion of the base plate 1010. Each grip claw 1012 can be displaced to be in contact with or separated from the periphery of the wafer W by a non-illustrated grip claw opening/closing mechanism. The first spin chuck 1002 can hold the wafer W horizontally by gripping the periphery of the wafer W with the plurality of grip claws 1012.

A hollow rotational shaft 1014 extends vertically downwards from a central portion of a bottom surface of the base plate 1010. The rotational shaft 1014 is rotated and driven by a motor 1016, and, thus, the wafer W held on the first spin chuck 1002 can be rotated around the vertical axis line.

The base plate 1010 is equipped with through holes through which the lift pins 1004 pass. The lift pins 1004 are pressed down by springs 1018. The lift pins 1004 cannot be displaced to be lower than positions illustrated in FIG. 5 due to locking protrusions that are not illustrated in FIG. 5.

Under the lift pins 1004, push rods 1020 are provided in the same number as the lift pins 1004. If the base plate 1010 is stopped at a specific angular position, the lift pins 1004 and the push rods 1020 are aligned vertically. Bottom ends of the push rods 1020 are fixed to ring member 1022. A linear actuator 1024 including a ball screw, an air cylinder, etc. moves up the ring member 1022 so that the lift pins 1004 can be pushed up by the push rods 1020 to desired height positions.

Within the hollow rotational shaft 1014, a rod-shaped processing fluid supply member 1025 is provided. The processing fluid supply member 1025 is configured to maintain a non-rotation state even when the rotational shaft 1014 is rotated. The processing fluid supply member 1025 is equipped with one or more (e.g., two in the illustrated exemplary embodiment) processing fluid supply paths 1026 and 1028 extending vertically. Top ends of the respective processing fluid supply paths 1026 and 1028 are opened to a space under the central portion of the rear surface (bottom surface) of the wafer W.

Deionized water (DIW) as a rinse liquid is supplied into the processing fluid supply path 1026 from a rinse liquid supply mechanism 1030. A nitrogen gas ($N_2$ gas) as a drying gas is supplied into processing fluid supply path 1028 from a drying gas supply mechanism 1032. The DIW supplied from the rinse liquid supply mechanism 1030 and the nitrogen gas supplied from the drying gas supply mechanism 1032 are discharged from the openings at the top ends of the processing fluid supply paths 1026 and 1028, respectively, toward the rear surface (bottom surface) of the wafer W. That is, a top end portion of the processing fluid supply member 1025 serves as a bottom nozzle for discharging a processing fluid toward the rear surface of the wafer W.

The first liquid processing device 1000 is equipped with one or more (e.g., three in the present exemplary embodiment) nozzles 1034, 1036 and 1038 for supplying processing fluids onto a surface (top surface) of the wafer W held on the first spin chuck 1002. The nozzles 1034 and 1036 are supported at a front end portion of a first nozzle arm 1040. The nozzle 1038 is supported at a front end portion of a second nozzle arm 1042.

The first and second nozzle arms 1040 and 1042 are rotatable around vertical axis lines 1041 and 1043, respectively, and, thus, processing fluids can be supplied through the nozzles 1034, 1036 and 1038 to a certain position on the surface of the wafer W held on the first spin chuck 1002. One of the first and second nozzle arms 1040 and 1042 illustrated in FIG. 5 corresponds to the nozzle arm 2100 illustrated in FIG. 4, and the other of the first and second nozzle arms 1040 and 1042 does not illustrated in FIG. 4.

The nozzle 1034 is connected with a chemical liquid supply mechanism 1044 and a rinse liquid supply mechanism 1046. A chemical liquid to be supplied by the chemical liquid supply mechanism 1044 may be, for example, SC-1, DHF and the like. A rinse liquid to be supplied by the rinse liquid supply mechanism 1046 may be, for example, DIW and the like.

The nozzle 1036 is connected with an organic solvent supply mechanism 1048 configured to supply a drying organic solvent. The drying organic solvent to be supplied by the organic solvent supply mechanism 1048 may be, for example, IPA (isopropyl alcohol) serving as an organic solvent that can be easily replaced with the rinse liquid (DIW) (for example, having compatibility with the DIW) and has a higher volatility and a lower surface tension than the rinse liquid.

The nozzle 1038 is connected with a drying gas supply mechanism 1050. A drying gas to be supplied by the drying gas supply mechanism 1050 may be, for example, a nitrogen gas.

Each of the supply mechanisms 1030, 1032, 1044, 1046, 1048 and 1050 of the processing fluids (chemical liquid, rinse liquid, drying organic solvent and drying gas) may be composed of a processing fluid source, a fluid line (passageway) connected to the processing fluid source and a flow control device provided at the fluid line. The processing fluid source is, for example, a factory power supply provided in a semiconductor device manufacturing factory where the substrate processing system 1 is installed. The processing fluid source may be a liquid storage tank or a gas bombe provided in the substrate processing system 1. The flow control device may be, for example, an opening/closing valve, a flowmeter, a flow rate control valve and the like. The flow control device enables each processing fluid to be supplied at a controlled flow rate to the wafer W.

A liquid recovery cup 1060 is configured to collect a processing fluid (particularly, liquid) that has been supplied to the wafer W being rotated and then scattered from the wafer W. The liquid recovery cup 1060 is provided around the first spin chuck 1002. A bottom portion of the liquid recovery cup 1060 is connected with an exhaust passageway 1062 and a drain passageway 1066. The exhaust passageway 1062 is connected with a factory exhaust system maintained at a negative pressure, and, thus, a space inside the liquid recovery cup 1060 is continuously evacuated. A flow rate control device 1064 such as an exhaust damper or a butterfly valve is provided at the exhaust passageway 1062, and, thus, it is possible to control an exhaust flow rate in the exhaust passageway 1062. The exhaust passageway 1062 may be equipped with an ejector. The drain passageway 1066 is connected with a factory drain path.

Figure 3:
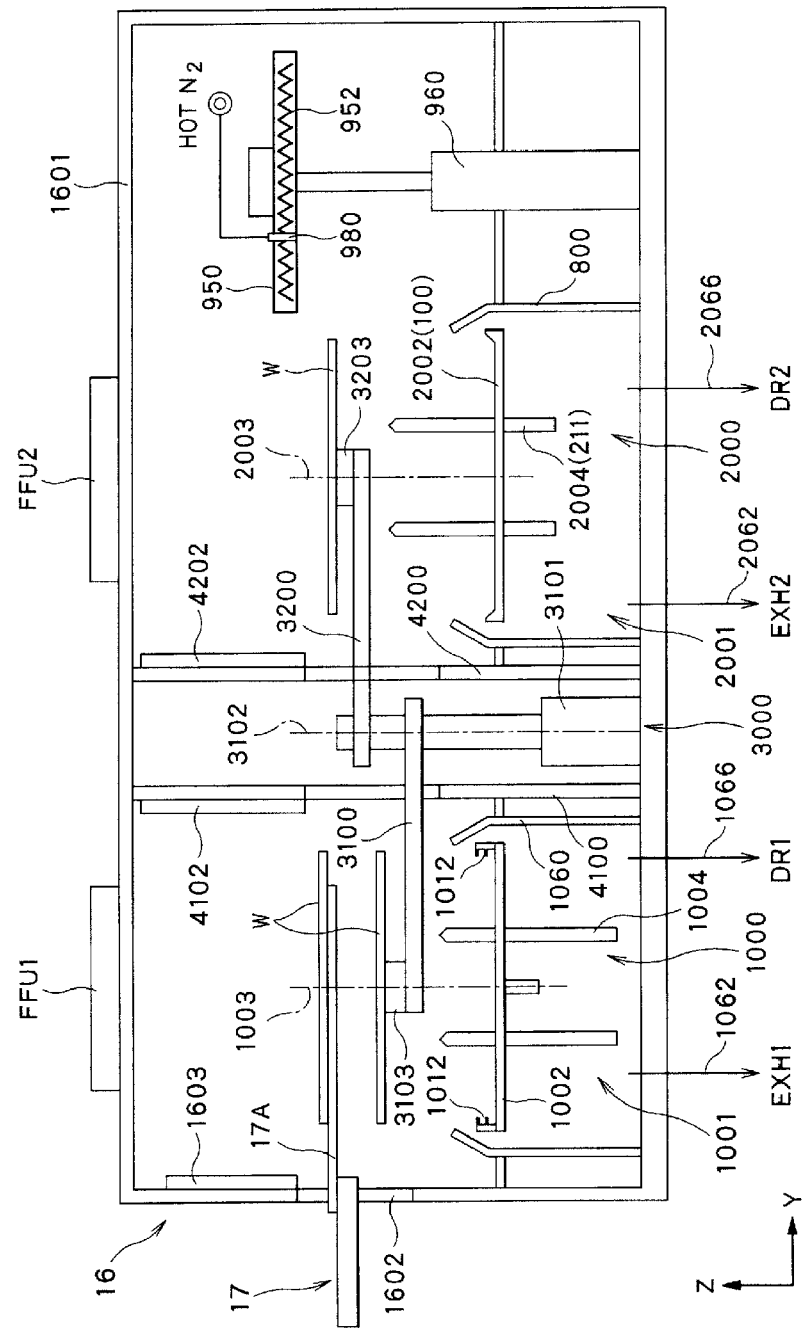
FIG. 3 is a schematic longitudinal cross-sectional view illustrating an example of a liquid processing module provided in the substrate processing apparatus illustrated in FIG. 1.
Figure 6:
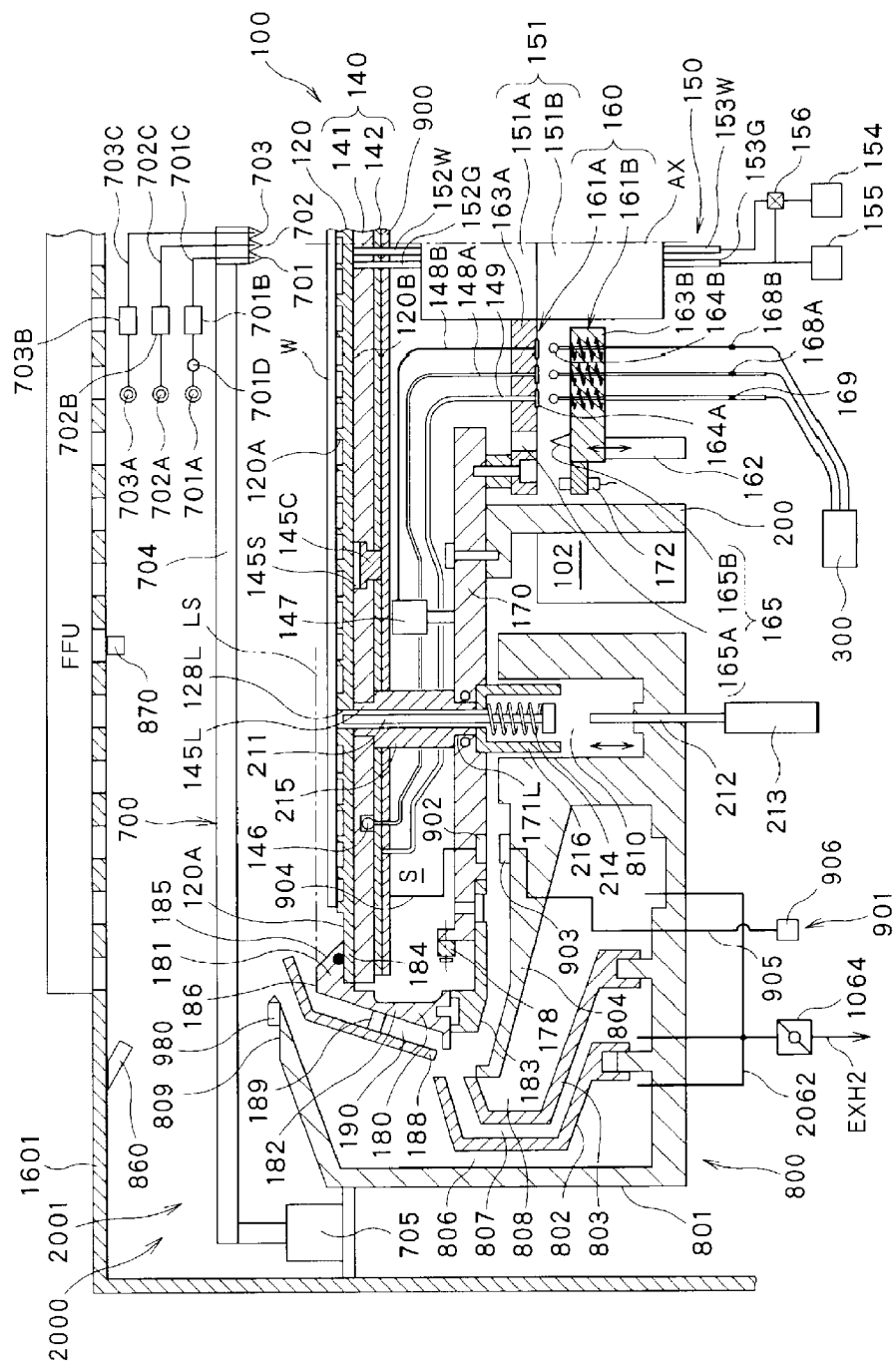
FIG. 6 is a schematic longitudinal cross-sectional view illustrating a configuration of a second liquid processing device of the liquid processing module illustrated in FIG. 3.

Further, the exhaust passageway 1062 and the drain passageway 1066 are also illustrated schematically in FIG. 3. An exhaust passageway 2062 (illustrated in FIG. 3 and FIG. 6) and a drain passageway 2066 (illustrated only in FIG. 3) identical to the exhaust passageway 1062 and the drain passageway 1066, respectively, are also provided in the second liquid processing device 2000. As illustrated in FIG. 6, the flow rate control device 1064 such as an exhaust damper or a butterfly valve is also provided at the exhaust passageway 2062. The exhaust passageway 2062 and the drain passageway 2066 are also connected with the factory exhaust system and the factory drain path, respectively.

The exhaust passageway 1062 may be provided to suction a gas directly from the inside of the first liquid processing device 1000 and an external space of the liquid recovery cup 1060 as well as from the liquid recovery cup 1060. Likewise, the exhaust passageway 2062 may be provided to suction a gas directly from the inside of the second liquid processing device 2000 and an external space of a liquid recovery cup 800 (see FIG. 3 and FIG. 6) as well as from the liquid recovery cup 800.

As illustrated in FIG. 3, a ceiling portion of the housing 1601 is equipped with a first fan filter unit FFU1 serving as a first gas supply at a position corresponding to the first liquid processing device 1000 and a second fan filter unit FFU2 serving as a second gas supply at a position corresponding to the second liquid processing device 2000. These fan filter units FFU1 and FFU2 can supply clean gases (clean air, clean dry air, nitrogen gas or a mixed gas thereof) into the first and second liquid processing devices 1000 and 2000, respectively. Desirably, flow rates of the clean gases supplied from the first fan filter unit FFU1 and the second fan filter unit FFU2, respectively, can be controlled independently.

A pressure (hereinafter, referred to as "pressure P1") inside the first liquid processing device 1000 is determined by a balance between a flow rate of gas supplied from the fan filter unit FFU1 and a flow rate of gas exhausted through the exhaust passageway 1062. Likewise, a pressure (hereinafter, referred to as "pressure P2") inside the second liquid processing device 2000 is determined by a balance between a flow rate of gas supplied from the fan filter unit FFU2 and a flow rate of gas exhausted through the exhaust passageway 2062. Therefore, in each of the first liquid processing device 1000 and the second liquid processing device 2000, by appropriately regulating at least one of the flow rate of gas to be supplied and the flow rate of gas to be exhausted, a relationship between the pressure P1 and the pressure P2 can be controlled as desired.

Herein, when a pressure inside the transfer path 15A is set to PT (typically referring to an atmospheric pressure), the PT desirably satisfies the condition of PT>P1>P2. Particularly, as described below, when a chemical liquid processing is performed at a high temperature within the second liquid processing device 2000, it is possible to suppress the inflow of the most highly contaminated atmosphere inside the second liquid processing device 2000 into the first liquid processing device 1000 and the transfer path 15A.

Hereinafter, a configuration of an exemplary embodiment of the second rotational liquid processing unit 2001 provided in the second liquid processing device 2000 will be described. The second rotational liquid processing unit 2001 is configured as a single-wafer type dip liquid processing unit.

As illustrated in FIG. 6, the second rotational liquid processing unit 2001 is equipped with the rotatable table 100 (second spin chuck), a processing liquid supply 700 configured to supply a processing liquid onto a wafer W and the liquid recovery cup (processing cup) 800 configured to collect a processing liquid scattered from a substrate being rotated. The rotatable table 100 is configured to rotate a circular substrate, such as a wafer W, while holding the substrate horizontally. The components, such as the rotatable table 100, the processing liquid supply 700 and the liquid recovery cup 800, of the second rotational liquid processing unit 2001 are accommodated within the housing 1601. FIG. 6 illustrates only a left half part of the second rotational liquid processing unit 2001.

The rotatable table 100 is configured as a vacuum suction type spin chuck (vacuum chuck). The rotatable table 100 is equipped with a suction plate 120, a hot plate 140, a supporting plate 170, a periphery cover body 180 and a hollow rotational shaft 200. The suction plate 120 suctions the wafer W placed thereon while holding the wafer W horizontally. The hot plate 140 supports and heats the suction plate 120 and serves as a base plate for the suction plate 120. The supporting plate 170 supports the suction plate 120 and the hot plate 140. The rotational shaft 200 extends downwards from the supporting plate 170. The rotatable table 100 is rotated around a rotation axis line Ax, which extends vertically, by an electric driver 102 provided around the rotational shaft 200. Thus, the rotatable table 100 can rotate the wafer W held thereon around the rotation axis line Ax. The electric driver 102 (not illustrated in detail) may transmit a power generated by an electric motor to the rotational shaft 200 via a power transmission mechanism (e.g., belt and pulley) and rotate and drive the rotational shaft 200. Otherwise, the electric driver 102 may directly rotate and drive the rotational shaft 200 by using the electric motor.

The suction plate 120 is a circular plate-shaped member having a slightly larger diameter than the wafer W (or the same diameter as that of the wafer W in some configurations), i.e., a circular plate-shaped member having the same or larger area than the wafer W. The suction plate 120 has a top surface (front surface) 120A that suctions a bottom surface (not to be processed) of the wafer W and a bottom surface (rear surface) 120B in contact with a top surface of the hot plate 140. The suction plate 120 may be made of a material having high thermal conductivity such as thermal conductive ceramic, for example, SiC. Desirably, the material of the suction plate 120 may have a thermal conductivity of 150 W/m·k or more.

The hot plate 140 is a circular plate-shaped member having substantially the same diameter as that of the suction plate 120. The hot plate 140 is equipped with a plate main body 141 and an electric heater 142 (heater) provided in the plate main body 141. The plate main body 141 is made of a material having high thermal conductivity such as thermal conductive ceramic, for example, SiC. Desirably, the material of the plate main body 141 may have a thermal conductivity of 150 W/m·k or more.

Figure 7:
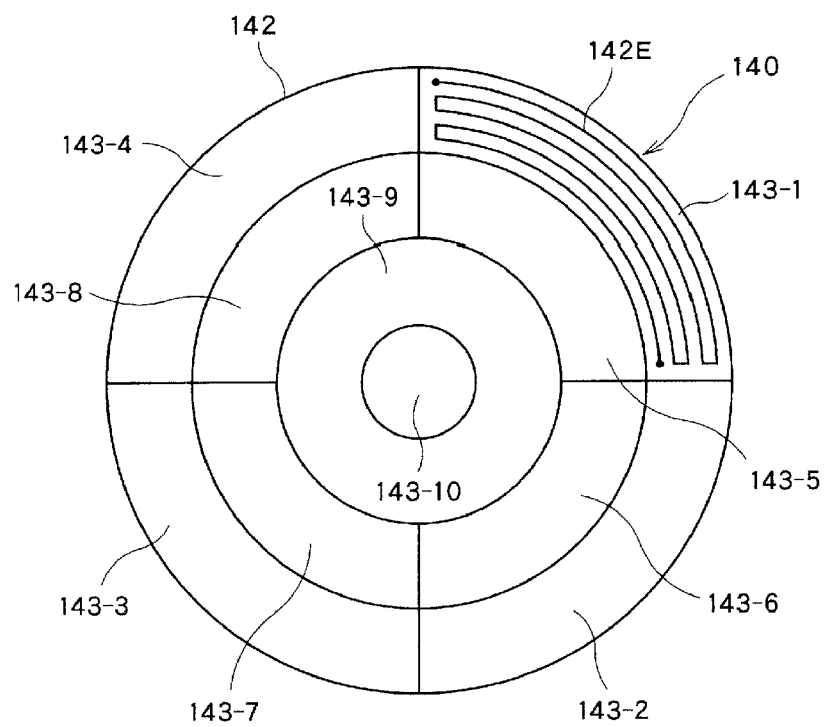
FIG. 7 is a schematic plan view for explaining an example of the arrangement of a heater in a hot plate provided in the second liquid processing device.

The heater 142 may be configured as a sheet-type heater, e.g., a polyimide heater, provided in a bottom surface (rear surface) of the plate main body 141. Desirably, a plurality of (e.g., ten) heating zones 143-1 to 143-10 as illustrated in FIG. 7 is set in the hot plate 140. The heater 142 is composed of a plurality of heater elements 142E assigned to the respective heating zones 143-1 to 143-10. The heater element 142E is made of a conductor extending in a zigzag shape within each of the heating zones 143-1 to 143-10. FIG. 7 illustrates only the heater element 142E within the heating zone 143-1.

An electric power can be independently supplied to each of the plurality of heater elements 142E by a power supply 300 to be described later. Therefore, the different heating zones for the wafer W can be heated in different conditions, and, thus, it is possible to control the temperature distribution of the wafer W.

An auxiliary heater 900 having substantially the same plan view shape as that of the heater 142 is also provided in a bottom surface of the heater 142. Like the heater 142, the auxiliary heater 900 may be configured as a sheet-type heater, e.g., a polyimide heater. Further, desirably, an insulating film made of a polyimide film may be provided between the heater 142 and the auxiliary heater 900, each of which can be configured as a polyimide heater. As can be understood from the following description, the auxiliary heater 900 is provided to heat (keep warmth of) the hot plate 140 in a time period, such as rotation of the rotatable table 100, during which the power cannot be supplied to the heater 142.

A plurality of heating zones may also be set in the auxiliary heater 900 and each of the heating zones may be controlled individually as in the heater 142. A single heating zone may be set in the heater 142 to uniformly heat the entire heater 142.

Figure 8:
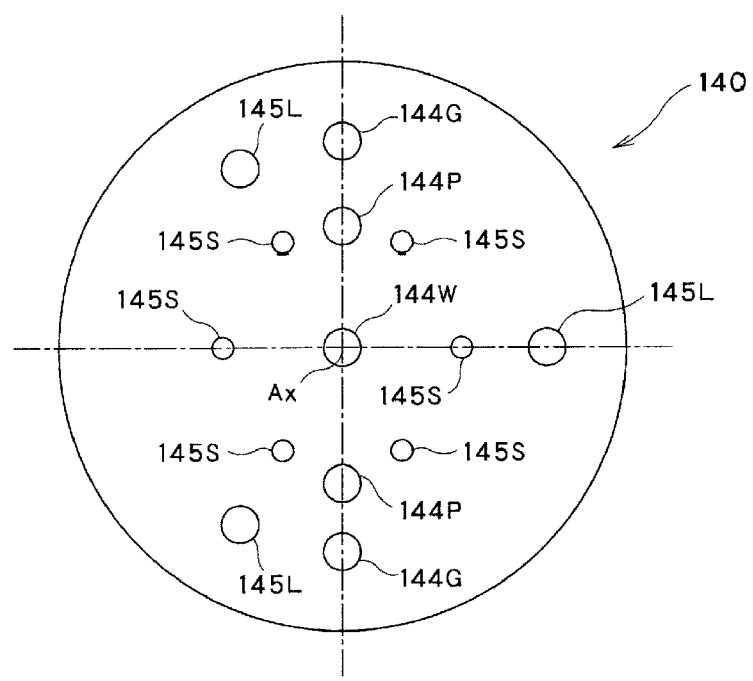
FIG. 8 is a schematic plan view illustrating a top surface of the hot plate.

As illustrated in FIG. 8, a top surface (front surface) of the plate main body 141 has one or more (e.g., two in the illustrated exemplary embodiment) plate suction openings 144P, one or more (e.g., one at a central portion in the illustrated exemplary embodiment) substrate suction opening 144W and one or more (e.g., two at a periphery portion in the illustrated exemplary embodiment) purge gas supply openings 144G. The plate suction openings 144P are used to transmit a suction force for suctioning the suction plate 120 onto the hot plate 140. The substrate suction opening 144W is used to transmit a suction force for suctioning the wafer W onto the suction plate 120.

Further, the plate main body 141 has a plurality of (e.g., three in the illustrated exemplary embodiment) lift pin holes 145L through which the lift pins 211 to be described later pass and a plurality of (e.g., six in the illustrated exemplary embodiment) service holes 145S configured to access screws for assembly of the rotatable table 100. During a normal operation, the service holes 145S are covered by caps 145C.

The heater elements 142E are arranged to avoid the plate suction openings 144P, the substrate suction opening 144W, the purge gas supply openings 144G, the lift pin holes 145L and the service holes 145S. When performing the connection with the rotational shaft 200 by an electromagnet, the service holes 145S may be omitted.

Figure 9:
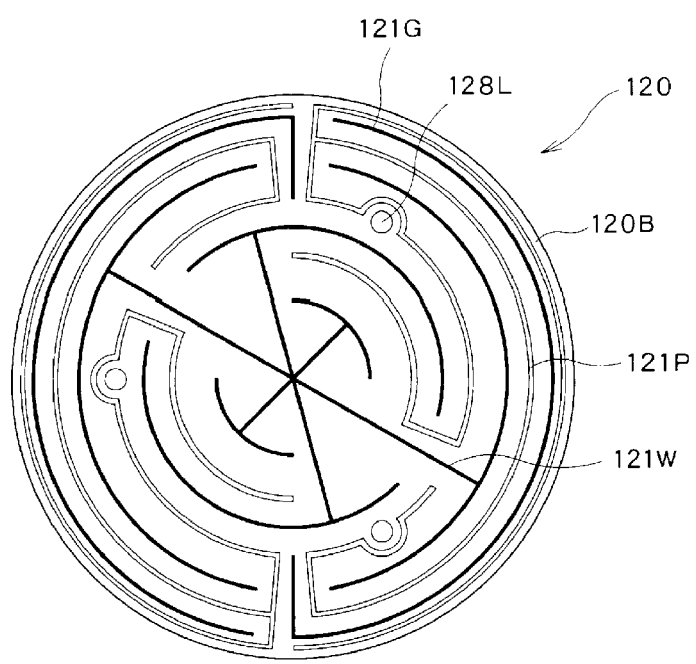
FIG. 9 is a schematic plan view illustrating an example of a configuration of a bottom surface of a suction plate provided in the second liquid processing device.

As illustrated in FIG. 9, a bottom surface 120B of the suction plate 120 has a plate bottom surface suction path groove 121P, a substrate bottom surface suction path groove 121W and a bottom surface purge path groove 121G. When the suction plate 120 is placed in an appropriate positional relationship on the hot plate 140, at least a part of the plate bottom surface suction path groove 121P communicates with the plate suction openings 144P. Likewise, at least a part of the substrate bottom surface suction path groove 121W communicates with the substrate suction opening 144W, and at least a part of the bottom surface purge path groove 121G communicates with the purge gas supply openings 144G. The plate bottom surface suction path groove 121P, the substrate bottom surface suction path groove 121W and the bottom surface purge path groove 121G are separated from each other (do not communicate with each other).

Figure 13:
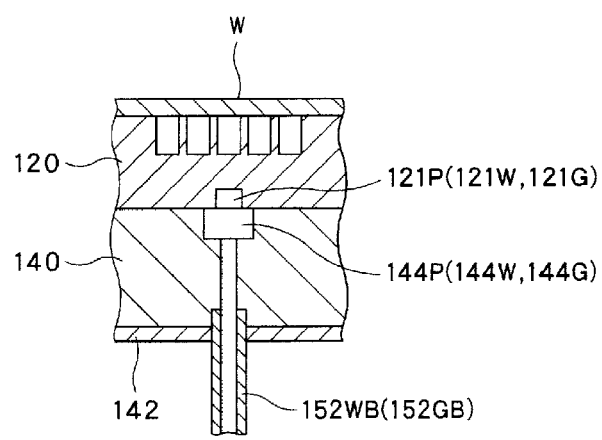
FIG. 13 is another schematic cross-sectional view of the suction plate as taken along a different cutting plane from FIG. 12.

FIG. 13 schematically illustrates a state where the suction openings 144P (or 144W or 144G) of the hot plate 140 and the path groove 121P (or 121W or 121G) of the suction plate 120 are overlapped to communicate with each other.

Figure 10:
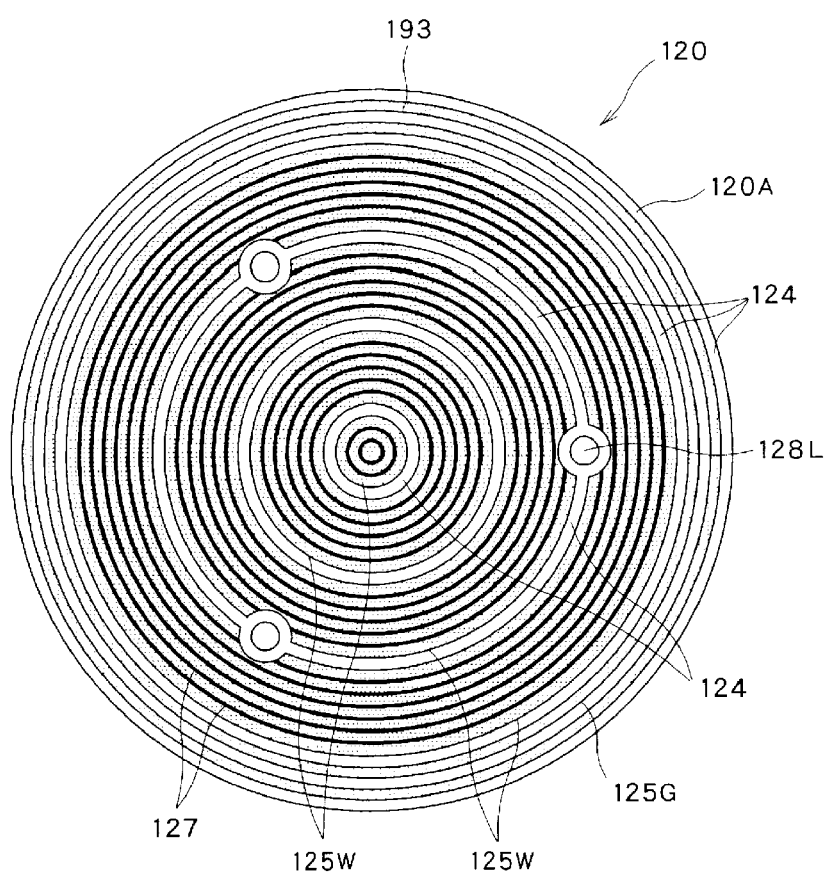
FIG. 10 is a schematic plan view illustrating an example of a configuration of a top surface of the suction plate.
Figure 12:
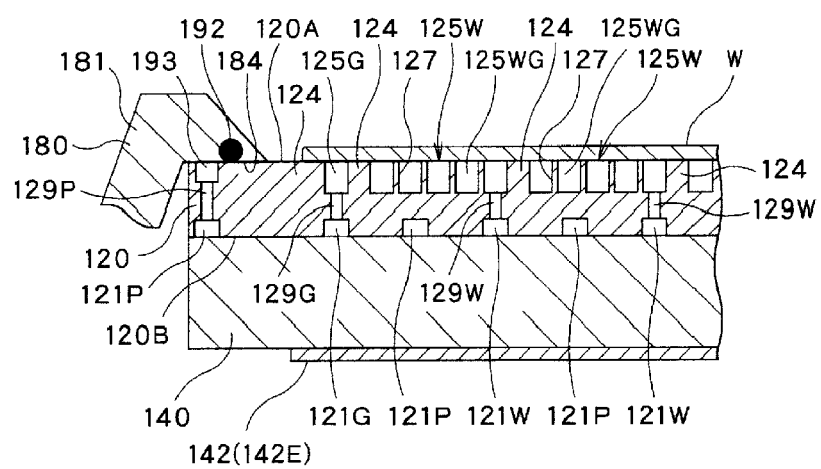
FIG. 12 is a schematic cross-sectional view of the suction plate.

As illustrated in FIG. 10 and FIG. 12, a plurality of (e.g., five in the illustrated exemplary embodiment) thick annular partition walls 124 is formed on a top surface 120A of the suction plate 120. The thick annular partition walls 124 define a plurality of recess regions 125W and 125G (e.g., four circular ring-shaped regions in an outer portion and a circular region in an innermost portion) separated from each other on the top surface 120A.

A plurality of through holes 129W (see FIG. 12) penetrating the suction plate 120 in a thickness direction is formed at a plurality of locations on the substrate bottom surface suction path groove 121W, and each of the through holes allows the substrate bottom surface suction path groove 121W to communicate with corresponding one of a plurality of (e.g., four in the illustrated exemplary embodiment) recess regions 125W.

A plurality of through holes 129G (see FIG. 12) penetrating the suction plate 120 in the thickness direction is formed at a plurality of locations on the bottom surface purge path groove 121G, and each of the through holes allows the bottom surface purge path groove 121G to communicate with a recess region 125G in an outermost portion. The recess region 125G in the outermost portion is a single circular ring-shaped top surface purge path groove.

In each of the four recess regions 125W in the inner portion, a plurality of thin annular separation walls 127 is provided concentrically. The thin separation walls 127 form at least one top surface suction path groove 125WG extending in a zigzag shape within each of the recess regions 125W. That is, the thin separation walls 127 uniformly disperse the suction force within each of the recess regions 125W.

As illustrated in FIG. 6, a suction/purge unit 150 is provided near the rotation axis line Ax. The suction/purge unit 150 has a rotary joint 151 provided within the hollow rotational shaft 200. An upper piece 151A of the rotary joint 151 is connected with a suction pipe 152W that communicates with the plate suction openings 144P and the substrate suction opening 144W of the hot plate 140 and a purge gas supply pipe 152G that communicates with the purge gas supply openings 144G.

A lower piece 151B of the rotary joint 151 is connected with a suction pipe 153W that communicates with the suction pipe 152W and a purge gas supply pipe 153G that communicates with the purge gas supply pipe 152G. The upper piece 151A and the lower piece 151B of the rotary joint 151 are configured to be relatively rotatable while the suction pipes 152W and 153W are kept in communication with each other and the purge gas supply pipes 152G and 153G are kept in communication with each other. The rotary joint capable of allowing a fluid to flow between the two relatively rotatable pieces without leakage has been well known in the technical field of fluid line.

The suction pipe 153W is connected with a suction device 154 such as a vacuum pump or the like. The purge gas supply pipe 153G is connected with a purge gas supply device 155. The suction pipe 153W is also connected with the purge gas supply device 155. Further, a switch device (e.g., three-way valve) 156 configured to switch a connection destination of the suction pipe 153W between the suction device 154 and the purge gas supply device 155 is provided.

A plurality of temperature sensors 146 configured to detect the temperature of the plate main body 141 of the hot plate 140 is embedded in the hot plate 140. The temperature sensors 146 may be provided, for example, in the ten heating zones 143-1 to 143-10, respectively. Further, at least one thermo switch 147 configured to detect overheating of the heater 142 is provided adjacent to the heater 142 of the hot plate 140.

In a space S between the hot plate 140 and the supporting plate 170, control signal lines 148A and 148B for sending detection signals from the temperature sensors 146 and the thermo switch 147 and a power supply line 149 for supplying electric power to each of the heater elements 142E of the heater 142 are provided in addition to the temperature sensors 146 and the thermo switch 147.

As illustrated in FIG. 6, a switch mechanism 160 is provided near the rotary joint 151. The switch mechanism 160 is equipped with a first electrode unit 161A fixed in a direction of the rotation axis line Ax, a second electrode unit 161B movable in the direction of the rotation axis line Ax and an electrode moving mechanism (lift mechanism) 162 configured to move (lift) the second electrode unit 161B in the direction of the rotation axis line Ax.

Figure 11:
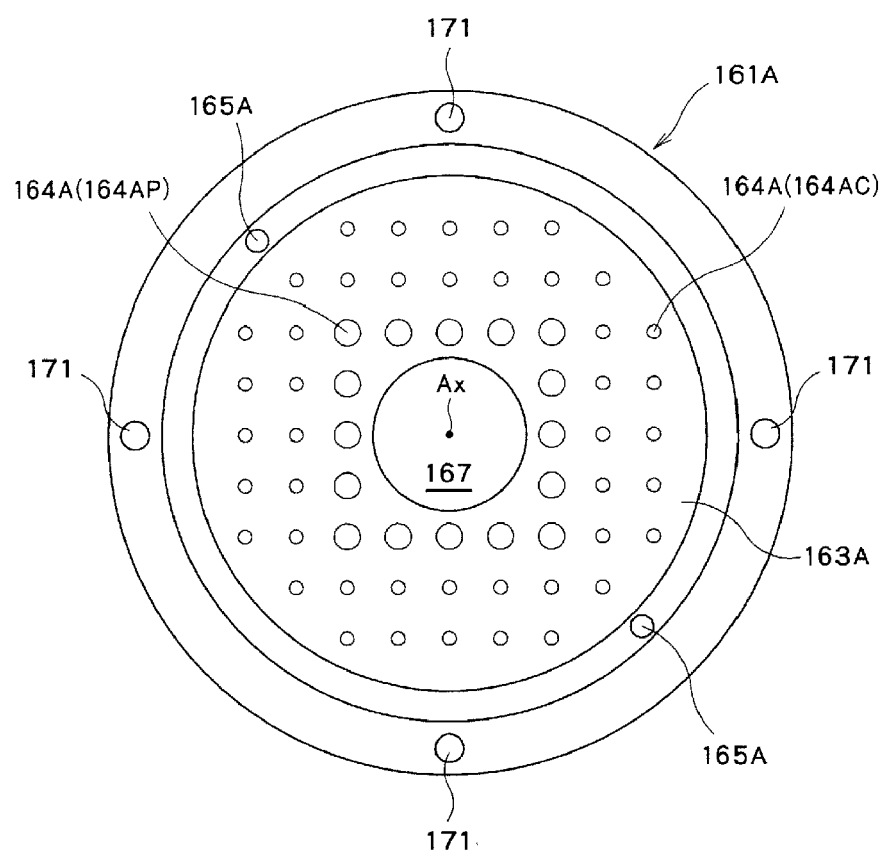
FIG. 11 is a schematic plan view illustrating an example of a configuration of a first electrode unit provided in the second liquid processing device.

As illustrated in FIG. 11, the first electrode unit 161A includes a first electrode supporting body 163A and a plurality of first electrodes 164A supported in the first electrode supporting body 163A. The plurality of first electrodes 164A includes first electrodes 164AC (illustrated as small "circles (o)" in FIG. 11) for communication of control signals which are connected with the control signal lines 148A and 148B and first electrodes 164AP (illustrated as large "circles (o)" in FIG. 11) for supply of electric power to the heater which are connected with the power supply line 149.

The first electrode supporting body 163A is a generally circular plate-shaped member. A circular hole 167 into which the upper piece 151A of the rotary joint 151 is inserted is formed at a central portion of the first electrode supporting body 163A. The upper piece 151A of the rotary joint 151 may be fixed to the first electrode supporting body 163A. A peripheral portion of the first electrode supporting body 163A may be screw-fixed to the supporting plate 170 through screw holes 171.

As schematically illustrated in FIG. 6, the second electrode unit 161B includes a second electrode supporting body 163B and a plurality of second electrodes 164B supported in the second electrode supporting body 163B. The second electrode supporting body 163B is a generally circular plate-shaped member having substantially the same diameter as that of the first electrode supporting body 163A illustrated in FIG. 11. A circular hole having a size that enables the lower piece 151B of the rotary joint 151 to pass therethrough is formed at a central portion of the second electrode supporting body 163B.

The second electrodes 164B, that can be moved up and down to be in contact with or separated from the first electrodes 164A, have the same planar arrangement as the first electrodes 164A. Further, hereinafter, the second electrodes 164B (power supply electrodes) to be in contact with the first electrodes 164AP (power reception electrodes) for supply of electric power to the heater will also be referred to as "second electrodes 164BP". Furthermore, the second electrodes 164B to be in contact with the first electrodes 164AC for communication of control signals will also be referred to as "second electrodes 164BC". The second electrodes 164BP are connected with power output ports of the power supply device (power supply) 300. The second electrodes 164BC are connected to control input/output ports of the power supply 300.

Conduction paths 168A, 168B and 169 (see FIG. 6) connecting the second electrodes 164B with the power output ports and the control input/output ports of the power supply 300, respectively, are formed of a wire that is at least partially flexible. Due to the flexible wire, while the second electrodes 164B are electrically connected with the power supply 300, the entire second electrode unit 161B can be rotated at predetermined angles in a forward rotation direction and a reverse rotation direction, respectively, from a neutral position around the rotation axis line Ax. The predetermined angle may be, for example, 180°, but are not limited thereto. This means that while the first electrodes 164A are connected with the second electrodes 164B, the rotatable table 100 can be rotated about ±180°.

One of the first electrode 164A and the second electrode 164B forming the pair with each other may be configured as a pogo pin. In FIG. 6, all of the second electrodes 164B are formed as pogo pins. The term "pogo pin" has been widely used referring to an extensible and contractible rod-shaped electrode equipped with a spring therein. Instead of the pogo pin, a socket, a magnet electrode or an induction electrode may be used as the electrode.

Desirably, a locking mechanism 165 may be provided. The locking mechanism 165 is configured to lock the first electrode supporting body 163A and the second electrode supporting body 163B so as not to be relatively rotatable when the first electrodes 164A and the second electrodes 164B are in appropriate contact with each other in pairs. For example, as illustrated in FIG. 6, the locking mechanism 165 may be composed of a hole 165A formed in the first electrode supporting body 163A and a pin 165B provided in the second electrode supporting body 163B to be inserted and fitted into the hole 165A.

Desirably, a device 172 (schematically illustrated in FIG. 6) may also be provided. The device 172 is configured to detect an appropriate contact between the first electrodes 164A and the second electrodes 164B in pairs. As the device 172, an angular position sensor (not illustrated) may be provided. The angular position sensor is configured to detect a state where the first electrode supporting body 163A and the second electrode supporting body 163B are in an appropriate angular positional relationship with each other. Otherwise, as the device 172, a distance sensor (not illustrated) may be provided. The distance sensor is configured to detect a state where the first electrode supporting body 163A and the second electrode supporting body 163B have an appropriate distance in the direction of the rotation axis line Ax. Alternatively, a contact type sensor (not illustrated) may be provided. The contact type sensor is configured to detect a state where the pin 165B is appropriately inserted and fitted into the hole 165A of the locking mechanism 165.

Although not illustrated in the drawing, the electrode moving mechanism 162 schematically illustrated in FIG. 6 may be composed of a push rod configured to push up the second electrode supporting body 163B and a lift mechanism (air cylinder, ball screw, etc.) configured to move up and down the push rod (Configuration example 1). In this configuration, for example, a permanent magnet may be provided in the first electrode supporting body 163A and an electromagnet may be provided in the second electrode supporting body 163B. Thus, the first electrode unit 161A and the second electrode unit 161B can be combined so as not to be relatively movable up and down, and the first electrode unit 161A and the second electrode unit 161B can be separated from each other as necessary.

In the configuration example 1, if the first electrode unit 161A and the second electrode unit 161B are combined with and separated from each other at the same angular position in the rotatable table 100, the second electrode unit 161B may not be supported so as to be rotatable around the rotation axis line Ax. That is, when the first electrode unit 161A is separated from the second electrode unit 161B, a member (e.g., the push rod or another supporting table) for supporting the second electrode unit 161B is needed.

Instead of the configuration example 1, another configuration example 2 may be employed. Although not illustrated in detail, the configuration example 2 of the electrode moving mechanism 162 includes a first ring-shaped member having a circular ring shape around the rotation axis line Ax, a second ring-shaped member configured to support the first ring-shaped member, a bearing provided between the first ring-shaped member and the second ring-shaped member and configured to enable relative rotation therebetween and a lift mechanism (air cylinder, ball screw, etc.) configured to move up and down the second ring-shaped member.

In any one of the configuration examples 1 and 2, while the first electrodes 164A and the second electrodes 164B are in appropriate contact with each other in pairs, the first electrode unit 161A and the second electrode unit 161B can be interlocked and rotated with each other within a predetermined angle range.

The electric driver 102 of the rotatable table 100 has a positioning function to stop the rotatable table 100 at a certain rotation angular position. The positioning function can be implemented by rotating a motor of the electric driver 102 based on detection values of a rotary encoder provided in the rotatable table 100 (or provided in a member rotated by the rotatable table 100). By moving the second electrode unit 161B upwards by the electrode moving mechanism 162 in a state where the rotatable table 100 is stopped at a predetermined rotation angular position, the electrodes in the first electrode unit 161A can be brought into appropriate contact with the corresponding electrodes in the second electrode unit 161B, respectively. When the second electrode unit 161B is separated from the first electrode unit 161A, it is desirable that the second electrode unit 161B and the first electrode unit 161A are separated from each other in a state that the rotatable table 100 is stopped at the predetermined rotation angular position.

As described above, a plurality of electrical components (heater, lines, sensors) is placed within the space S between the suction plate 120 and the supporting plate 170 and at positions facing the space S. The periphery cover body 180 suppresses a processing liquid, particularly a corrosive chemical liquid, to be supplied onto the wafer W from being introduced into the space S and thus protects the electrical components. A purge gas ($N_2$ gas) may be supplied into the space S through a pipe (not illustrated) branched from the purge gas supply pipe 152G. Thus, it is possible to suppress the inflow of a corrosive gas derived from the chemical liquid into the space S from the outside of the space S and thus possible to maintain the space S in a non-corrosive atmosphere.

Then, a power supply device for the auxiliary heater 900 will be described. The power supply device is equipped with a contact type power transmission mechanism. The power transmission mechanism is configured to enable the auxiliary heater 900 to be powered on even when the rotatable table 100 is continuously rotated in one direction (but the supply of electric power to the heater 142 through the switch mechanism 160 is impossible). The power transmission mechanism is provided on the same axis as the rotary joint 151 (see FIG. 6) and may be desirably mounted on or integrated with the rotary joint 151.

Figure 14A:
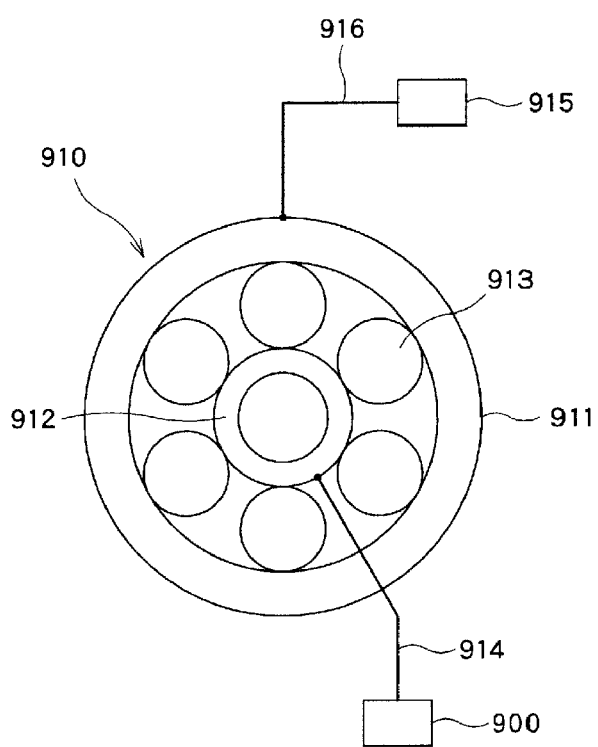
FIG. 14A is a schematic diagram for explaining a principle of a first configuration example of a power transmission mechanism used for power supply to an auxiliary heater provided in the second liquid processing device.

A power transmission mechanism 910 according to the configuration example 1 will be described with reference to an operational principle diagram of FIG. 14A and an axis-direction cross-sectional view of FIG. 14B. As illustrated in FIG. 14A, the power transmission mechanism 910 has a similar configuration to an electric bearing (ball or roller bearing) and includes an outer lace 911, an inner lace 912 and a plurality of rolling elements (e.g., balls) 913. The outer lace 911, the inner lace 912 and the rolling elements 913 are made of conductive materials. Desirably, an appropriate pre-load is applied between the constituent elements 911, 912 and 913 of the power transmission mechanism 910. Thus, it is possible to secure more stable electrical connection between the outer lace 911 and the inner lace 912 via the rolling elements 913.

Figure 14B:
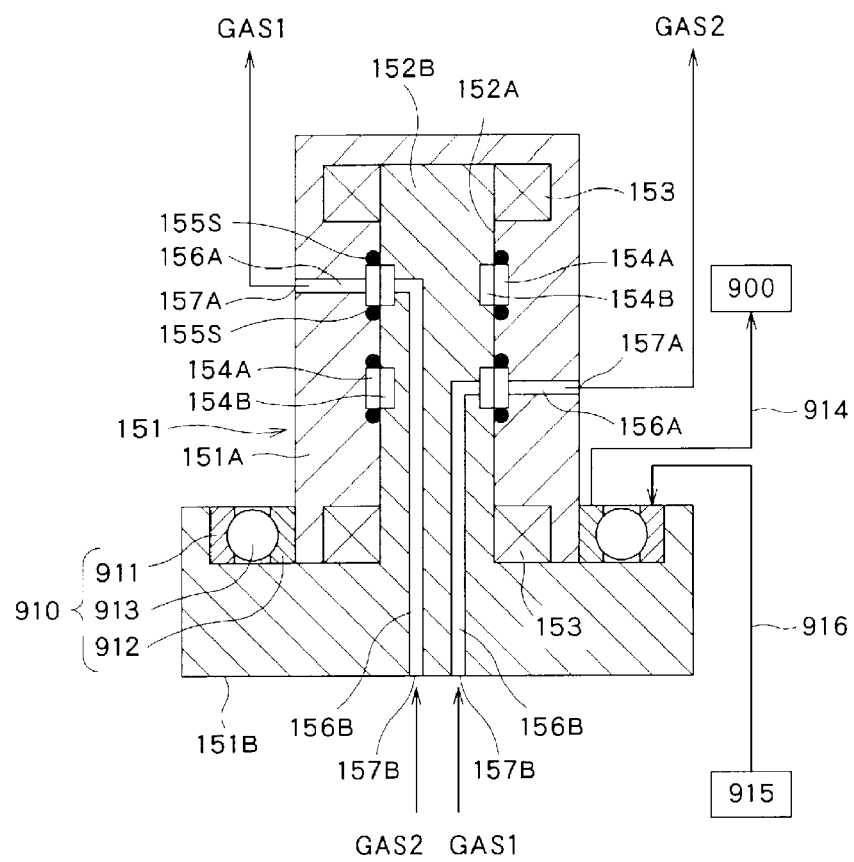
FIG. 14B is a schematic axis-direction cross-sectional view of the first configuration example of the power transmission mechanism used for power supply to the auxiliary heater provided in the second liquid processing device.

A specific example of the rotary joint 151 equipped with the power transmission mechanism 910 according to the above-described operational principle is illustrated in FIG. 14B. The rotary joint 151 includes the lower piece 151B fixed to a frame (not illustrated) provided within the housing 1601 (see FIG. 6) or a bracket (not illustrated) fixed to the frame and the upper piece 151A fixed to the rotatable table 100 or a member (not illustrated) rotated with the rotatable table 100.

The configuration of the rotary joint 151 illustrated in FIG. 14B has been well known in the art and will be described briefly. That is, a columnar central protrusion 152B of the lower piece 151B is inserted into a cylindrical central hole 152A of the upper piece 151A. The central protrusion 152B is supported on the upper piece 151A via a pair of bearings 153. Further, circumferential grooves 154A are formed in the same number as the kinds of gases (e.g., but not limited to, two gases GAS1 and GAS2 in FIG. 14B) to be treated on an inner circumferential surface of the central hole 152A. Furthermore, seal rings 155S configured to suppress leakage of gas are provided on both sides of each circumferential groove 154A. Within the upper piece 151A, gas openings 156A respectively communicating with the plurality of circumferential grooves 154A are formed. An end of each gas opening 156A serves as a gas outlet port 157A. A plurality of circumferential grooves 154B is provided at axis-directional positions corresponding to the plurality of circumferential grooves 154A, respectively, on an outer circumferential surface of the central protrusion 152B. Within the lower piece 151B, gas openings 156B respectively communicating with the plurality of circumferential grooves 154B are formed. An end of each gas opening 156B serves as a gas inlet port 157B.

According to the configuration illustrated in FIG. 14B, even when the upper piece 151A and the lower piece 151B are rotated, it is possible to allow a gas to flow between the gas inlet ports 157B and the gas outlet ports 157A without actual leakage of gas. Also, it is possible to transmit a suction force between the gas inlet ports 157B and the gas outlet ports 157A.

The power transmission mechanism 910 is mounted between the upper piece 151A and the lower piece 151B of the rotary joint 151. In the example illustrated in FIG. 148, the outer lace 911 is inserted and fitted (e.g., press-fitted) into a cylindrical recess of the lower piece 151B, and a columnar outer circumferential surface of the upper piece 151A is inserted and fitted (e.g., press-fitted) into the inner lace 912. An appropriate electrical insulation processing has been performed between the outer lace 911 and the lower piece 151B and between the upper piece 151A and the inner lace 912. The outer lace 911 is electrically connected with a power supply (or power supply controller) 915 through a wire 916, and the inner lace 912 is electrically connected with the auxiliary heater 900 through a wire 914. Further, in the example illustrated in FIG. 14B, the inner lace 912 is a rotary part that is rotated together with the rotatable table 100 and the outer lace 911 is a fixed part that is not rotated.

Furthermore, in the configuration illustrated in FIG. 14B, the power transmission mechanism 910 is equipped with electric bearings at multiple levels in an axis-direction, and, thus, it is possible to supply electric power through multiple channels. In this case, a plurality of heating zones is provided in the auxiliary heater 900, and, thus, it is possible to supply electric power to each heating zone independently.

Figure 14C:
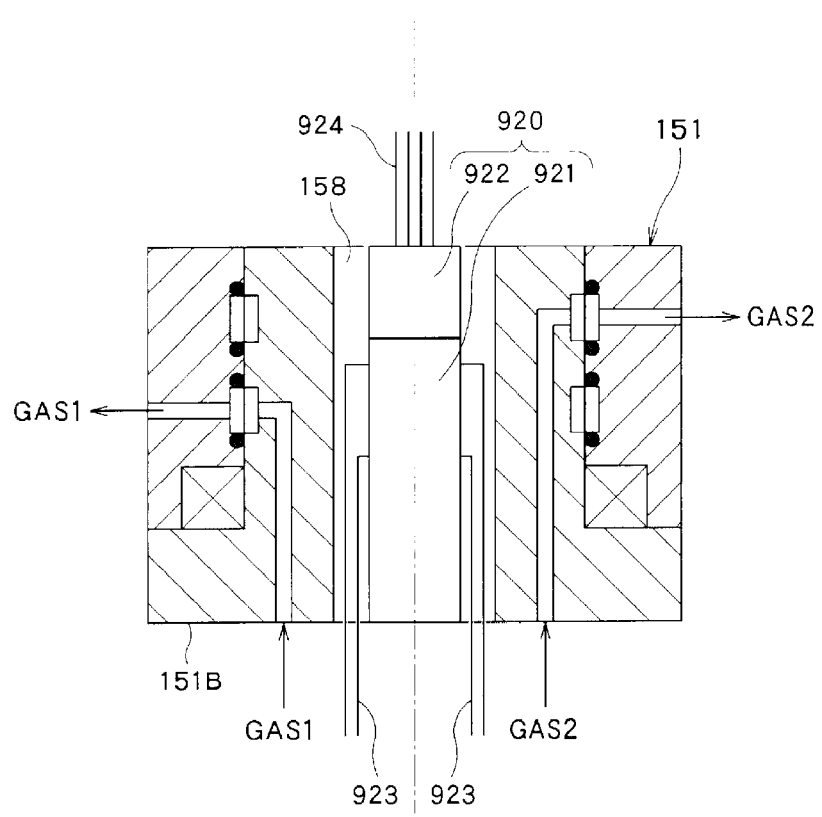
FIG. 14C is a schematic axis-direction cross-sectional view of a second configuration example of the power transmission mechanism used for power supply to the auxiliary heater provided in the second liquid processing device.

A power transmission mechanism 920 according to the configuration example 2 will be described with reference to FIG. 14C. The power transmission mechanism 920 illustrated in FIG. 14C is formed as a well-known slip ring and configured to supply electric power through multiple channels. The slip ring is composed of a fixed part 921 and a rotary part 922. The fixed part 921 is fixed to the frame (not illustrated) provided within the housing 1601 or the bracket (not illustrated) fixed to the frame. The rotary part 922 is fixed to the rotatable table 100 or the member (not illustrated) rotated with the rotatable table 100. On a side circumferential surface of the fixed part 921, a plurality of ports connected with a plurality of wires 923 electrically connected with a power supply or a power supply controller (not illustrated) is provided. A plurality of wires 924 electrically connected with the plurality of ports extends from an axis-direction cross section of the rotary part 922 and is electrically connected with the auxiliary heater 900 (see FIG. 6).

In a configuration example illustrated in FIG. 14C, the lower piece 151B of the rotary joint 151 is formed as a hollow member having a through hole 158 at a center thereof. The power transmission mechanism 920 formed as a slip ring is accommodated inside the through hole 158. The lower piece 151B of the rotary joint 151 is fixed to the frame (not illustrated) provided within the housing 1601 (see FIG. 6) or the bracket (not illustrated) fixed to the frame as in the configuration example illustrated in FIG. 14B. Also, the upper piece 151A of the rotary joint 151 is fixed to the rotatable table 100 or the member (not illustrated) interlocked and rotated with the rotatable table 100.

The power supply device may be formed as an electromagnetic induction type using magnetic field coupling or magnetic resonance type of wireless (non-contact type) power transmission mechanism (which itself has been well known in the art). In this case, the wireless power transmission mechanism is composed of a power transmission coil 903 and a power reception coil 902 facing each other with a gap therebetween and extending in the circumferential direction, as schematically illustrated in FIG. 6. A ferrite sheet (not illustrated) for collecting magnetic flux and suppressing leakage of magnetic field is provided around the power transmission coil 903 and the power reception coil 902. The power transmission coil 903 may be provided at a non-rotary member such as a fixed outer cup element 801, and the power reception coil 902 may be provided at a rotary member such as the supporting plate 170. The power reception coil 902 is electrically connected with the auxiliary heater 900 through a wire 904. The power transmission coil 903 is electrically connected with a power supply (or power supply controller) 906 through a wire 905.

Even when the non-contact type power transmission mechanisms 902 and 903 schematically illustrated in FIG. 6 are used, e.g., the power transmission coil 903 and the power reception coil 902 are provided in a plurality of sets. Thus, it is possible to supply electric power through multiple channels.

Also, a distributor (not illustrated) configured to distribute electric power transmitted through the power transmission mechanisms into multiple channels and a control module (not illustrated) configured to control the supply of electric power to each heating zone may be provided at an appropriate portion within the space S between the hot plate 140 and the supporting plate 170. Thus, even if the power transmission mechanisms correspond to a single channel, a plurality of heating zones is provided in the auxiliary heater 900, and, thus, it is possible to supply electric power to each heating zone independently.

A power supply device for supplying electric power to the auxiliary heater 900 is not limited to the above-described examples and may include a power supply device using any one well-known power transmission mechanism including a power transmission part (fixed part) and a power reception part (rotary part) which are relatively rotatable to each other while transmitting electric power at a desired level.

If a power transmission mechanism is configured to transmit electric power through multiple channels, one or a plurality of channels may be used to transmit control signals or detection signals.

The power transmission mechanism illustrated in FIG. 6 and FIG. 14A to FIG. 14C may serve in part or in whole of a function of supplying electric power to the main heater 142 via the switch mechanism 160 described above with reference to FIG. 6 and FIG. 11 and a function of transmitting control/detection signals. In this case, the switch mechanism 160 may be completely decommissioned or the configuration of the switch mechanism 160 may be partly omitted.

In the above-described exemplary embodiment, the heater (main heater) 142, i.e., the first heater element, and the auxiliary heater 900, i.e., the second heater element, supplied with electric power by independent power supply systems, respectively, are provided. However, the above-described exemplary embodiment is not limited thereto. For example, the auxiliary heater 900 may not be provided and the main heater 142 may be configured to be supplied with electric power by a first power supply system including the switch mechanism 160 and a second power supply system including the power transmission mechanisms 910 and 920 and the power transmission mechanisms 902 and 903. In this case, the main heater 142 may be supplied with electric power by one selected from the first power supply system and the second power supply system.

As illustrated in FIG. 6, the periphery cover body 180 includes an upper part 181, a side peripheral part 182 and a lower part 183. The upper part 181 protrudes upwards relative to the suction plate 120 and is connected with the suction plate 120. The lower part 183 of the periphery cover body 180 is connected with the supporting plate 170.

An inner periphery of the the upper part 181 of the periphery cover body 180 is located on an inner side in a radial direction relative to an outer periphery of the suction plate 120. The upper part 181 includes a circular ring-shaped bottom surface 184 in contact with a top surface of the suction plate 120, an inclined circular ring-shaped inner peripheral surface 185 upwardly extending from an inner periphery of the bottom surface 184 and a circular ring-shaped outer peripheral surface 186 extending substantially horizontally from an outer periphery of the inner peripheral surface 185 toward the outside in the radial direction. The inner peripheral surface 185 is inclined so as to gradually decrease in height toward a central portion of the suction plate 120.

Desirably, a sealing treatment is performed between the top surface 120A of the suction plate 120 and the bottom surface 184 of the upper part 181 of the periphery cover body 180 in order to suppress introduction of liquid. The sealing treatment may be performed using an O-ring 192 placed between the top surface 120A and the bottom surface 184.

As illustrated in FIG. 9, a part of the plate bottom surface suction path groove 121P extends in the circumferential direction on an outermost peripheral portion of the suction plate 120. Further, as illustrated in FIG. 10, a recess groove 193 extends continuously in the circumferential direction on an outermost peripheral portion of the top surface 120A of the suction plate 120. As illustrated in FIG. 12, the bottom surface suction path groove 121P and the recess groove 193 on the outermost periphery communicate with each other through a plurality of through holes 129P penetrating the suction plate 120 in the thickness direction and provided apart from each other in the circumferential direction. The bottom surface 184 of the upper part 181 of the periphery cover body 180 is placed on the recess groove 193. Therefore, the bottom surface 184 of the upper part 181 of the periphery cover body 180 is suctioned onto the top surface 120A of the suction plate 120 by a negative pressure applied to the plate bottom surface suction path groove 121P. Thus, the O-ring 192 is pressed so that secure sealing can be achieved.

The height of the outer peripheral surface 186, i.e., the top of the periphery cover body 180, is higher than that of a top surface of a wafer W held on the suction plate 120. Therefore, if a processing liquid is supplied to the top surface of the wafer W in a state where the wafer W is held on the suction plate 120, a liquid accumulation (puddle) may be formed to immerse the wafer W so that the top surface of the wafer W can be located at a lower position than a liquid surface LS. That is, the upper part 181 of the periphery cover body 180 forms a bank surrounding the wafer W held on the suction plate 120. This bank and the suction plate 120 define a recess where the processing liquid can be reserved.

The inclination of the inner peripheral surface 185 of the upper part 181 of the periphery cover body 180 facilitates smooth scattering of the processing liquid in the recess toward the outside when the rotatable table 100 is rotated at a high speed. That is, this inclination suppresses the stagnation of the liquid on the inner peripheral surface 185 of the upper part 181 of the periphery cover body 180 when the rotatable table 100 is rotated at a high speed.

A rotary cup (rotary liquid receiving member) 188 that is rotated together with the periphery cover body 180 is provided outside the periphery cover body 180 in the radial direction. The rotary cup 188 is connected with a component of the rotatable table 100, e.g., the periphery cover body 180 in the illustrated exemplary embodiment, via a plurality of connection members 189 provided apart from each other in the circumferential direction. A top end of the rotary cup 188 is located at a position where the rotary cup 188 can receive the processing liquid scattered from the wafer W. A path 190 through which the processing liquid scattered from the wafer W flows down is formed between an outer peripheral surface of the side peripheral part 182 of the periphery cover body 180 and an inner peripheral surface of the rotary cup 188.

The liquid recovery cup 800 surrounds the rotatable table 100 and collects the processing liquid scattered from the wafer W. In the illustrated exemplary embodiment, the liquid recovery cup 800 includes a fixed outer cup element 801, a first movable cup element 802 and a second movable cup element 803 which can be moved up and down, and a fixed inner cup element 804. Each of a first drain path 806, a second drain path 807 and a third drain path 808 is formed between two adjacent cup elements (between 801 and 802, between 802 and 803 and between 803 and 804). By changing the positions of the first and second movable cup elements 802 and 803, it is possible to guide a processing liquid flowed from the path 190 between the periphery cover body 180 and the rotary cup 188 to any one selected from the three drain paths 806, 807 and 808. Each of the first drain path 806, the second drain path 807 and the third drain path 808 is connected with any one of an acid drain path, an alkaline drain path and an organic drain path (all of which are not illustrated) provided in the semiconductor device manufacturing factory. Within the first drain path 806, the second drain path 807 and the third drain path 808, a non-illustrated gas-liquid separation structure is provided. The first drain path 806, the second drain path 807 and the third drain path 808 are connected with the factory exhaust system via an exhaust device (not illustrated) such as an ejector and suctioned. The liquid recovery cup 800 has been well known as disclosed in the publications related to the prior applications by the present applicant, Japanese Patent Laid-open Publication No. 2012-129462, Japanese Patent Laid-open Publication No. 2014-123713 and the like. These publications will be referred to for details thereof. The liquid recovery cup 1060 of the first liquid processing device 1000 may also be configured as described above.

Each of the suction plate 120 and the supporting plate 170 is provided with three lift pin holes 128L and 171L, respectively, to be aligned with the three lift pin holes 145L of the hot plate 140 in the direction of the rotation axis line Ax.

The rotatable table 100 includes a plurality of (e.g., three in the illustrated exemplary embodiment) lift pins 211 penetrating the lift pin holes 145L, 128L and 171L. Each of the lift pins 211 can be moved between a delivery position (ascending position) where top ends of the lift pins 211 protrude upwards relative to the top surface 120A of the suction plate 120 and a processing position (descending position) where the top ends of the lift pins 211 are located under the top surface 120A of the suction plate 120.

A push rod 212 is provided under each of the lift pins 211. The push rod 212 can be moved up and down by a lift mechanism 213 such as an air cylinder. When bottom ends of the lift pins 211 are pushed up by the push rods 212, the lift pins 211 can be moved up to the delivery position. The push rods 212 may be provided in a ring-shaped supporting body (not illustrated) around the rotation axis line Ax and the ring-shaped supporting body may be moved up and down by a common lift mechanism to move up and down the push rods 212.

A wafer W carried on the lift pins 211 at the delivery position may be located at a higher height position than a top end 809 of the fixed outer cup element 801, and the wafer W may be delivered to the arm (see FIG. 1) of the substrate transfer device 17 that has entered into the second rotational liquid processing unit 2001.

When the lift pins 211 becomes far from the push rod 212, the lift pins 211 are moved down to the processing position by an elastic force of a return spring 214 and maintained at the processing position. In FIG. 6, reference numeral 215 denotes a guide member configured to guide a vertical movement of the lift pins 211 and reference numeral 216 denotes a spring receiver configured to receive the return spring 214. Further, the fixed inner cup element 804 includes a circular ring-shaped recess 810 that enables the rotation of the spring receiver 216 around the rotation axis line Ax.

The processing liquid supply 700 is equipped with a plurality of nozzles. The plurality of nozzles includes a chemical liquid nozzle 701 and a rinse nozzle 702. A chemical liquid is supplied into the chemical liquid nozzle 701 from a chemical liquid source 701A through a chemical liquid supply mechanism 701B including a flow control device (not illustrated), such as an opening/closing valve and a flow rate control valve, provided in a chemical liquid supply line (pipe) 701C.

A rinse liquid is supplied into the rinse nozzle 702 from a rinse liquid source 702A through a rinse liquid supply mechanism 702B including a flow control device (not illustrated), such as an opening/closing valve and a flow rate control valve, provided in a rinse liquid supply line (pipe) 702C.

The plurality of nozzles may include a nozzle 703 for supplying another processing fluid. The nozzle 703 may be supplied with a processing fluid (e.g., another chemical liquid) through a processing fluid supply mechanism 703B including a flow control device (not illustrated), such as an opening/closing valve and a flow rate control valve, provided in a processing fluid supply line (pipe) 703C.

A heater 701D serving as a temperature control mechanism for controlling the temperature of the chemical liquid may be provided in the chemical liquid supply line 701C. Further, a tape heater (not illustrated) for controlling the temperature of the chemical liquid may be provided in a pipe of the chemical liquid supply line 701C. Such heaters may also be provided in the rinse liquid supply line 702C.

The chemical liquid nozzle 701, the rinse nozzle 702 and the nozzle 703 are supported by a front end of a nozzle arm 704. A base end of the nozzle arm 704 is supported by a nozzle arm driving mechanism 705 configured to move up and down and revolve the nozzle arm 704. The nozzle arm driving mechanism 705 enables the chemical liquid nozzle 701 and the rinse nozzle 702 to be located at a certain position in the radial direction above the wafer W (position in the radial direction of the wafer W).

A wafer sensor 860 configured to detect whether a wafer W is present on the rotatable table 100 and one or a plurality of infrared thermometers 870 (only one illustrated) configured to detect the temperature of the wafer W (or the temperature of the processing liquid present on the wafer W) are provided on the ceiling portion of the housing 1601. If the plurality of infrared thermometers 870 is provided, it is desirable for the infrared thermometers 870 to detect the temperatures of the regions of the wafer W corresponding to the heating zones 143-1 to 143-10, respectively.

As illustrated in FIG. 3 and FIG. 4, a circular plate-shaped top plate 950 having substantially the same diameter as the wafer W is provided within the second liquid processing device 2000. A heater 952 is embedded in the top plate 950.

The top plate 950 can be moved between a cover position and a standby position by a plate moving mechanism 960.

The cover position of the top plate 950 refers to a position where the top plate 950 is close to a wafer held on the rotatable table 100, as illustrated in the operational diagrams of FIG. 15E and FIG. 15M to be described later.

The standby position refers to a position where the top plate 950 is sufficiently far from the rotatable table 100 not to interfere with a revolution of the nozzle arm 704 and not to interfere with carry-out/in operations of the wafer W with respect to the rotatable table 100.

The standby position may be located outside the liquid recovery cup 800 when viewed from the top as illustrated in FIG. 3 and FIG. 4 or right above the liquid recovery cup 800.

If the standby position is located right above the liquid recovery cup 800, it is possible to reduce a footprint of the second liquid processing device 2000. In this case, the plate moving mechanism 960 just needs to function to move up and down the top plate 950. Further, in this case, a fan filter unit FFU may be provided on a side wall of the housing 1601.

If the standby position is located outside the liquid recovery cup 800, the FFU may be placed in a typical manner (i.e., may be provided on a ceiling portion of the second liquid processing device 2000). In this case, the plate moving mechanism 960 functions to move the top plate 950 vertically and horizontally.

Figure 15A:
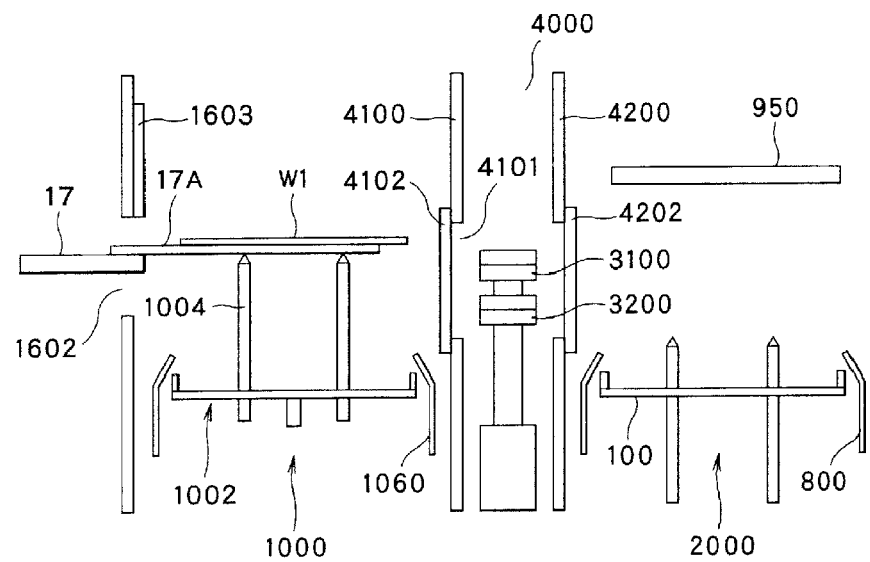
FIG. 15A is a schematic diagram for explaining a sequence of operations of the liquid processing module.

Although the top plate 950 is not illustrated in FIG. 6, if the top plate 950 is located at the standby position, the top plate 950 is located, for example, behind the nozzle arm 704. FIG. 15A to FIG. 15R illustrate that the standby position is located right above the liquid recovery cup 800 for easy understanding of movements of the top plate 950.

A temperature-controlled gas supply configured to supply a heated gas into the second liquid processing device 2000 may be provided. The temperature-controlled gas supply is equipped with, for example, a temperature control gas nozzle 980 provided in the top plate 950 as schematically illustrated in FIG. 3. The temperature control gas nozzle 980 may supply a hot $N_2$ gas (heated nitrogen gas) toward a space under the top plate 950. For example, the temperature control gas nozzle 980 may be configured to discharge the hot N$_2$ gas downwards from the center of the circular top plate 950. The temperature control gas nozzle 980 may be provided on a peripheral portion of a top opening of the fixed outer cup element 801 as schematically illustrated in FIG. 6. In this case, the temperature control gas nozzle 980 discharges the hot N$_2$ gas (heated nitrogen gas) toward a space above the wafer W.

Hereinafter, the sequence of a series of processings to be performed on a single wafer W by the liquid processing module 16 will be described with reference to FIG. 15A to FIG. 15Q. The operations to be described below can be performed when the control device 4 (controller 18) illustrated in FIG. 1 controls the operations of the respective components of the substrate transfer device 17 and the liquid processing module 16.

First, as illustrated in FIG. 15A, the shutter 1603 is opened so that the transfer arm 17A of the substrate transfer device 17 carries a non-processed wafer W (meaning a first wafer to be assigned reference numeral W1) into the first liquid processing device 1000 through the carry-out/in port 1602. The transfer arm 17A locates the wafer W1 right above the first spin chuck 1002. Then, front ends of the lift pins 1004 stand by slightly under the wafer W1.

Figure 15B:
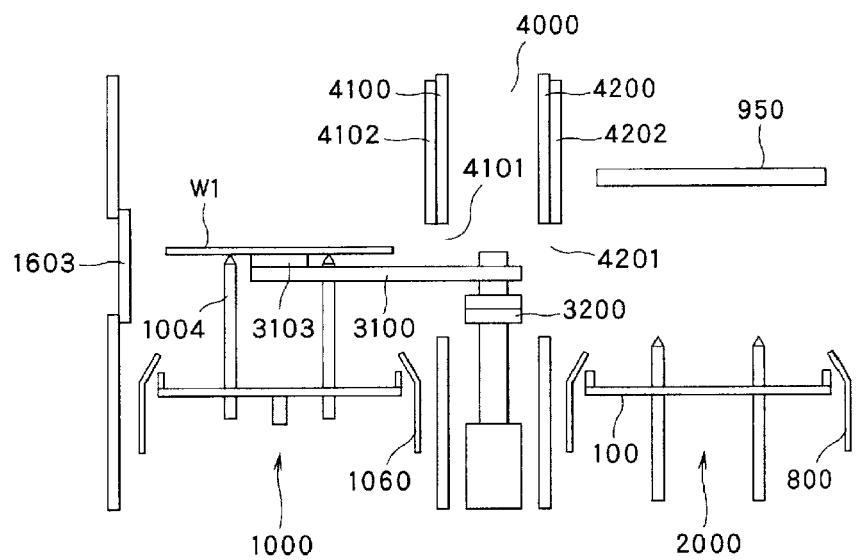
FIG. 15B is a schematic diagram for explaining the sequence of operations of the liquid processing module.

Thereafter, the lift pins 1004 receive the wafer W1 from the transfer arm 17A that has unclamped the wafer W1. Then, the transfer arm 17A is retreated from the first liquid processing device 1000. Thereafter, the shutter 1603 is closed. Then, the shutters 4102 and 4202 are opened so that the first arm 3100 is located under the wafer W1 supported by the lift pins 1004. Then, the vacuum chuck 3103 of the first arm 3100 receives the wafer W1 from the lift pins 1004. The vacuum chuck 3103 vacuum suctions the wafer W1 (see FIG. 15B).

Further, a wafer W may be delivered between the lift pins 1004 and the transfer arm 17A by means of a relative up-down movement between the lift pins 1004 and the transfer arm 17A, and the relative up-down movement may be performed by moving any one side of the lift pins 1004 and the transfer arm 17A. That is, an up-down movement function for implementing the relative up-down movement to deliver the wafer W just needs to be performed by at least any one side of the lift pins 1004 and the transfer arm 17A. Further, before the transfer arm 17A delivers the wafer W to the lift pins 1004, the transfer arm 17A unclamps the wafer W. After the transfer arm 17A receives the wafer W from the lift pins 1004, the transfer arm 17A clamps the wafer W. The descriptions in this paragraph will be omitted in the following description of the operations.

Likewise, the wafer W may be delivered between the lift pins 1004 and 2004 and the vacuum chucks 3103 and 3203 by means of a relative up-down movement between the lift pins and the vacuum chucks, and the relative up-down movement may be performed by moving any one side of the lift pins and the vacuum chucks (i.e., first or second arm). That is, an up-down movement function for implementing the relative up-down movement to deliver the wafer W just needs to be performed by at least any one side of the lift pins and the vacuum chucks. Further, before the vacuum chucks 3103 and 3203 deliver the wafer W to the lift pins 1004 and 2004, the vacuum chucks release the vacuum suction of the wafer W. After the vacuum chucks 3103 and 3203 receive the wafer W from the lift pins 1004 and 2004, the vacuum chucks vacuum suction the wafer W. The descriptions in this paragraph will be omitted in the following description of the operations.

The wafer W1 may be delivered directly from the transfer arm 17A to the vacuum chuck 3103 without the lift pins 1004. When the transfer arm 17A and the vacuum chuck 3103 are relatively moved up, if the transfer arm 17A, the vacuum chuck 3103 and the first arm 3100 are formed so as not interfere with each other, such an operation can be performed.

Then, the first arm 3100 enters into the second liquid processing device 2000 through the openings 4101 and 4201 and locates the wafer W1 right above the second spin chuck 2002 (corresponding to the rotatable table 100 illustrated in FIG. 6). Here, front ends of the lift pins 2004 (corresponding to the lift pins 211 illustrated in FIG. 6) stand by slightly under the wafer W1 (see FIG. 15C). Then, the lift pins 2004 receive the wafer W1 from the vacuum chuck 3103. Thereafter, the first arm 3100 is retreated from the second liquid processing device 2000 and is moved into the arm standby space 4000. Then, the shutters 4102 and 4202 are closed. The lift pins 2004 supporting the wafer W1 are moved down, and, thus, the wafer W1 is placed on the second spin chuck 2002. The second spin chuck 2002 configured as a vacuum chuck suctions the wafer W1 (see FIG. 15D).

Then, the wafer W1 is processed in the second liquid processing device 2000. This processing is now briefly described and will be described in detail later. As illustrated in FIG. 15D, a heated etching liquid is supplied from the chemical liquid nozzle 701 onto the wafer W1 being held and rotated on the second spin chuck 2002 and a film of the etching liquid is formed on a surface of the wafer W1. Thereafter, the rotation of the wafer W1 is stopped and then the supply of the etching liquid from the chemical liquid nozzle 701 is stopped. Thus, the surface of the wafer W1 is covered by the film of the stopped etching liquid (formation of etching liquid puddle).

Figure 15C:
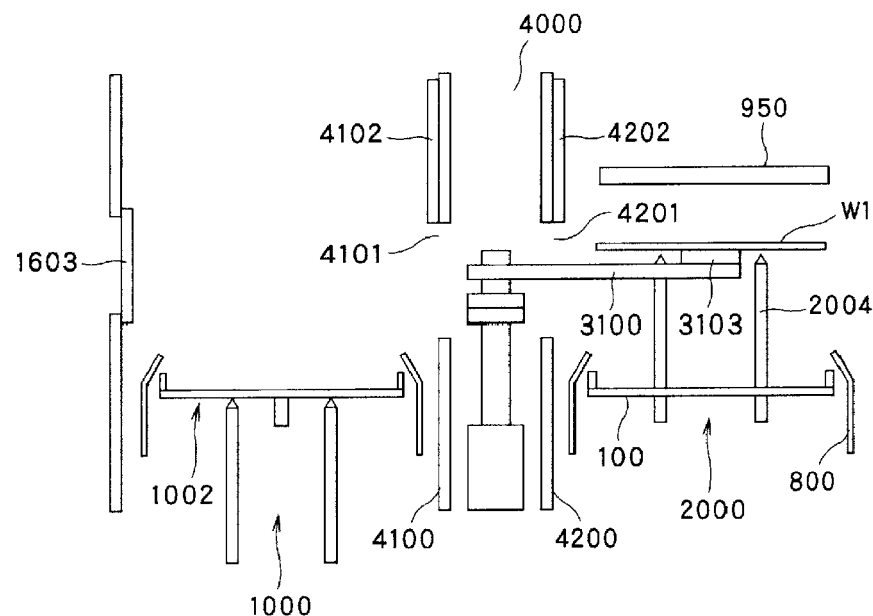
FIG. 15C is a schematic diagram for explaining the sequence of operations of the liquid processing module.
Figure 15D:
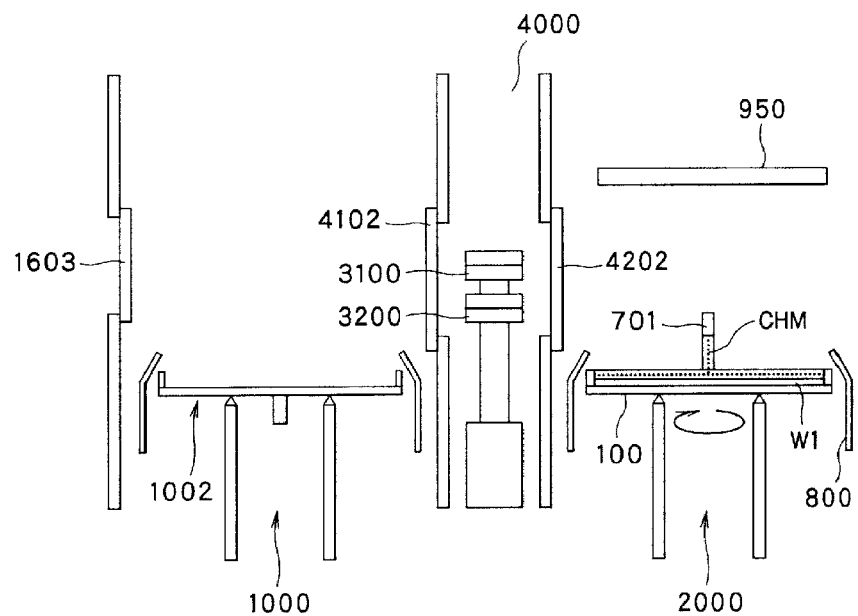
FIG. 15D is a schematic diagram for explaining the sequence of operations of the liquid processing module.
Figure 15E:
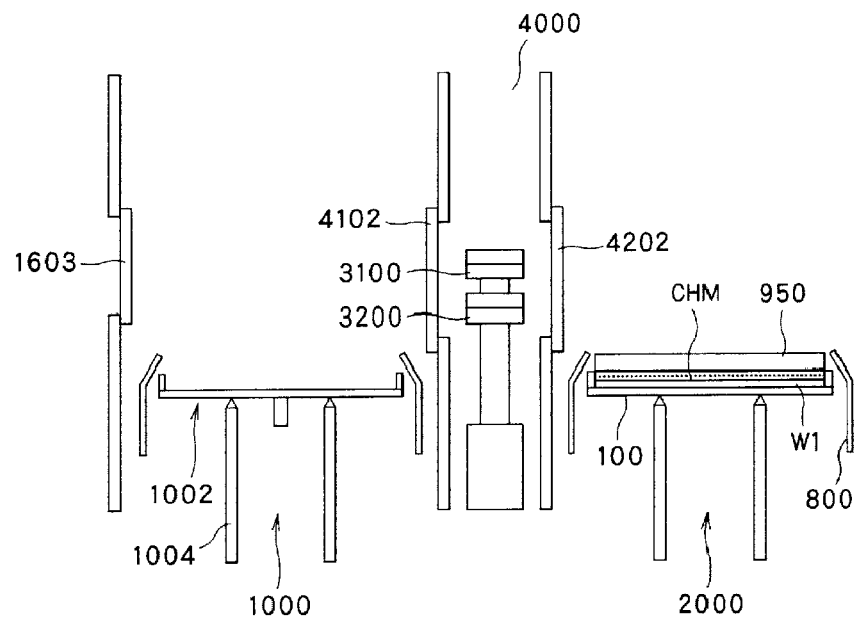
FIG. 15E is a schematic diagram for explaining the sequence of operations of the liquid processing module.

Then, as illustrated in FIG. 15E, the top plate 950 is moved down to a position near a surface of the liquid film of the etching liquid on the wafer W1. The wafer W1 and the liquid film of the etching liquid are heated to a suitable temperature for etching by heaters (corresponding to the heater 142 and the auxiliary heater 900 provided in the rotatable table 100 illustrated in FIG. 6) embedded in the second spin chuck 2002.

Herein, the heater 952 embedded in the top plate 950 functions to keep warmth of the wafer W1 and the liquid film of the etching liquid. Further, a bottom surface of the top plate 950 has been heated by the heater 952, and, thus, vapor generated from the etching liquid heated on the wafer W1 does not condense on the bottom surface of the top plate 950. For this reason, a vapor pressure in a space (gap) between the surface of the liquid film of the etching liquid and the bottom surface of the top plate 950 is maintained. Therefore, it is possible to suppress the evaporation of the etching liquid and thus possible to maintain the concentration of the etching liquid within a desired range.

By keeping a state where the surface of the wafer W1 is covered by the liquid film of the heated etching liquid for a predetermined time period, the etching processing (wet etching process) of the wafer W1 is ended. Further, the etching liquid on the wafer W1 may be stirred by rotating the wafer W1, for example, by a half turn in a forward rotation direction and a reverse rotation direction. Thus, it is possible to promote etching and improve the in-plane uniformity in etching amount.

Figure 15F:
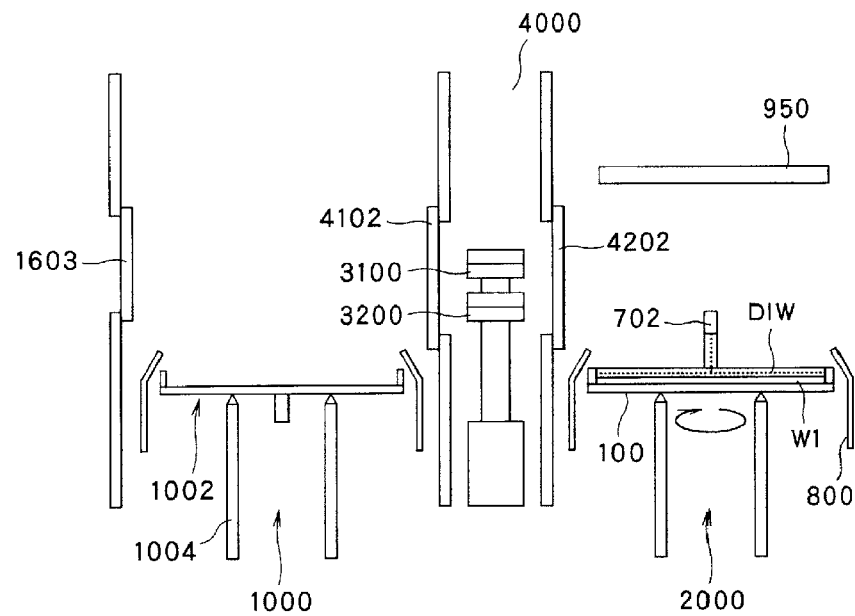
FIG. 15F is a schematic diagram for explaining the sequence of operations of the liquid processing module.

When the etching processing is ended, the top plate 950 is moved to the standby position as illustrated in FIG. 15F. Then, the wafer W1 starts to be rotated. Further, the rinse liquid DIW is supplied from the nozzle 702. Thus, a rinse processing (rinse process) for removing the etching liquid and by-products of an etching reaction from the surface of the wafer W1 is performed.

When the rinse processing is ended, the rotation of the wafer W1 is stopped and then, the supply of the rinse liquid from the nozzle 702 is stopped. Thus, the surface of the wafer W1 is covered by a film of the stopped rinse liquid (formation of rinse liquid puddle (puddle forming process)) (see FIG. 15G).

It is desirable to control the film thickness of the rinse liquid puddle so that the rinse liquid cannot be overflowed from the surface of the wafer W1 and cannot be dried on the wafer W1 while being transferred from the second liquid processing device 2000 to the first liquid processing device. The film thickness of the rinse liquid may be controlled, for example, by appropriately combining the control of a supply flow rate of the rinse liquid from the nozzle 702 and the control of the number of rotations of the wafer W1 with the control of timing of stopping the supply of the rinse liquid from the nozzle 702.

Figure 15G:
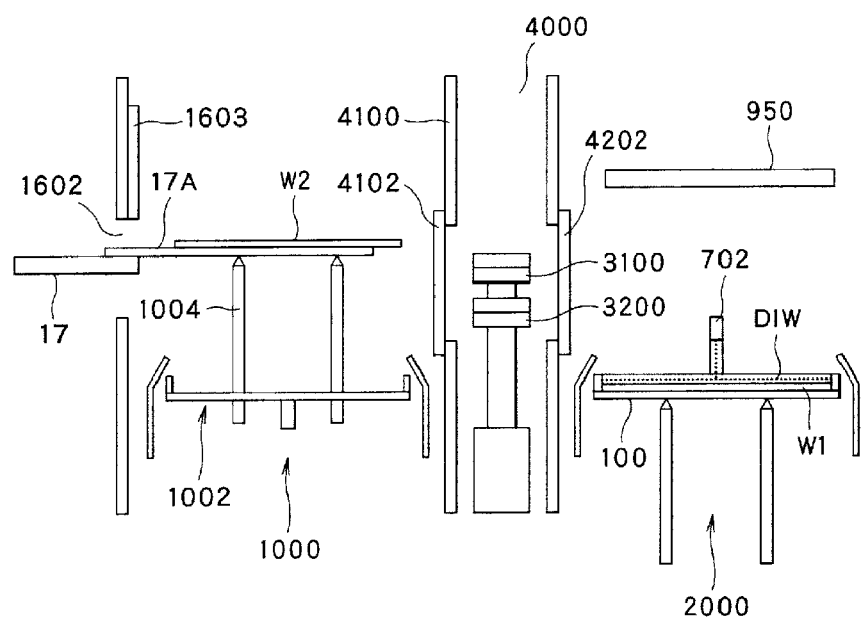
FIG. 15G is a schematic diagram for explaining the sequence of operations of the liquid processing module.

Slightly before the rinse liquid puddle is formed on the wafer W1 within the second liquid processing device 2000, the shutter 1603 is opened as illustrated in FIG. 15G and the transfer arm 17A carries a second wafer W2 into the first liquid processing device 1000. The state of the first liquid processing device 1000 illustrated in FIG. 15G is identical to that of the first liquid processing device 1000 illustrated in FIG. 15A.

Figure 15H:
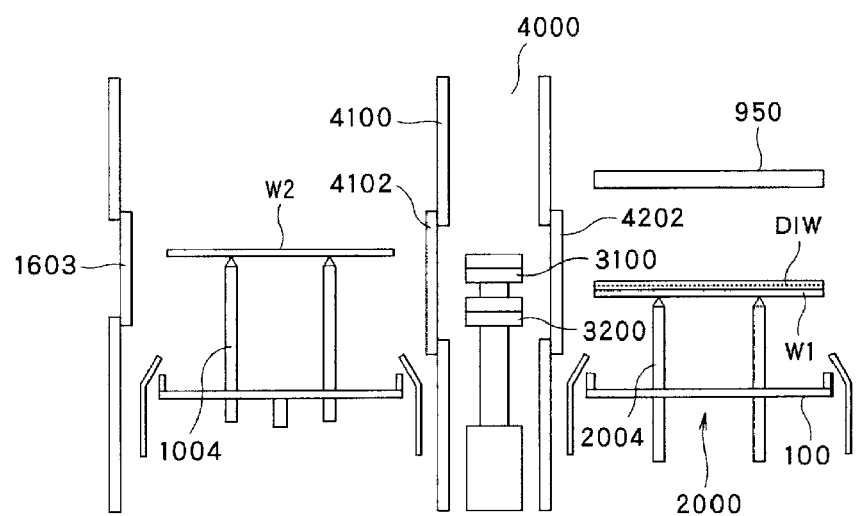
FIG. 15H is a schematic diagram for explaining the sequence of operations of the liquid processing module.

Then, as illustrated in FIG. 15H, the wafer W1 on which the rinse liquid puddle has been formed is moved up by the lifts pins 2004 within the second liquid processing device 2000 and located above a wafer placing surface of the second spin chuck 2002. Here, the wafer W1 is located at a suitable height position for delivery between the lift pins 2004 and the second arm 3200 (located at a lower height position than the first arm 3100).

Meanwhile, as illustrated in FIG. 15H, the wafer W2 is delivered from the transfer arm 17A to the lift pins 1004 within the first liquid processing device 1000. Thereafter, the transfer arm 17A is retreated from the first liquid processing device 1000 and then, the shutter 1603 is closed. A change from the state of the first liquid processing device 1000 illustrated in FIG. 15G to the state illustrated in FIG. 15H is identical to a change from the state illustrated in FIG. 15A to the state illustrated in FIG. 15B, and redundant description will be omitted.

Figure 15I:
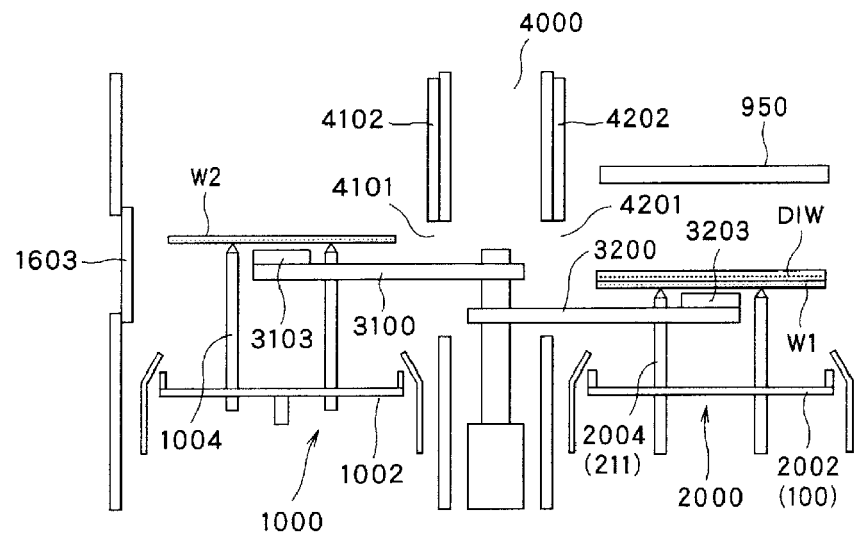
FIG. 15I is a schematic diagram for explaining the sequence of operations of the liquid processing module.

Then, as illustrated in FIG. 15I, the shutters 4102 and 4202 are opened and the vacuum chuck 3103 of the first arm 3100 is located slightly under the wafer W2 held by the lift pins 1004 at a suitable height position for delivery to the first arm 3100. Further, the vacuum chuck 3203 of the second arm 3200 is located slightly under the wafer W1 held by the lift pins 2004 at a suitable height position for delivery to the second arm 3200. Then, the first arm 3100 receives the wafer W2 from the lift pins 1004 by the method described above with reference to FIG. 15B, and the second arm 3200 receives the wafer W1 from the lift pins 2004 by the same method.

Figure 15J:
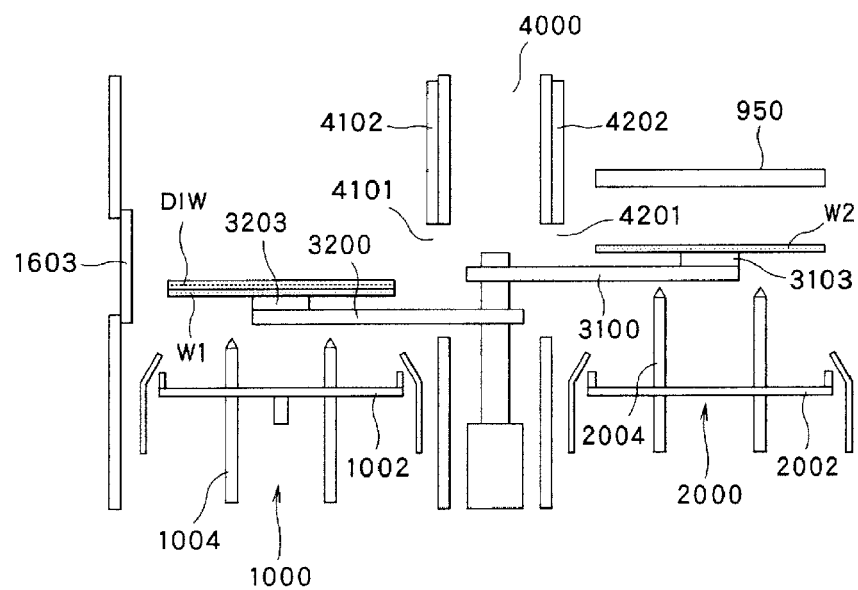
FIG. 15J is a schematic diagram for explaining the sequence of operations of the liquid processing module.

Then, as illustrated in FIG. 15J, the first arm 3100 and the second arm 3200 revolve simultaneously. Thus, the first arm 3100 carries the wafer W2 into the second liquid processing device 2000 and locates the wafer W2 right above the second spin chuck 2002. Also, the second arm 3200 carries the wafer W1 into the first liquid processing device 1000 and locates the wafer W1 right above the first spin chuck 1002. That is, the wafer W1 is exchanged with the wafer W2 between the first liquid processing device 1000 and the second liquid processing device 2000.

During the exchange, the wafer W2 held by the first arm 3100 is a non-processed dry wafer and the wafer W1 held by the second arm 3200 is a wafer on which the rinse liquid puddle has been formed. During the exchange, a revolution trajectory of the second arm 3200 (movement trajectory of the wafer W1) is under a revolution trajectory of the first arm 3100 (movement trajectory of the wafer W2). Therefore, even if the rinse liquid present on the wafer W1 overflows, there is no concern that the wafer W2 can be submerged in the rinse liquid.

Desirably, the revolution of the first arm 3100 and the revolution of the second arm 3200 may be performed completely simultaneously. However, the revolution of the first arm 3100 and the revolution of the second arm 3200 may be performed at slightly different timings.

Thereafter, the lift pins 1004 receive the wafer W1 from the second arm 3200 and then, the second arm 3200 is retreated into the arm standby space 4000. Further, the lift pins 1004 that has received the wafer W1 is moved down to a height position where the grip claws 1012 of the first spin chuck 1002 can grip the wafer W1. Then, the wafer W1 is held by the grip claws 1012 of the first spin chuck 1002. Thereafter, the lift pins 1004 are moved down so that top ends of the lift pins 1004 can be located on the same plane as or lower than a top surface of the base plate 1010.

Figure 15K:
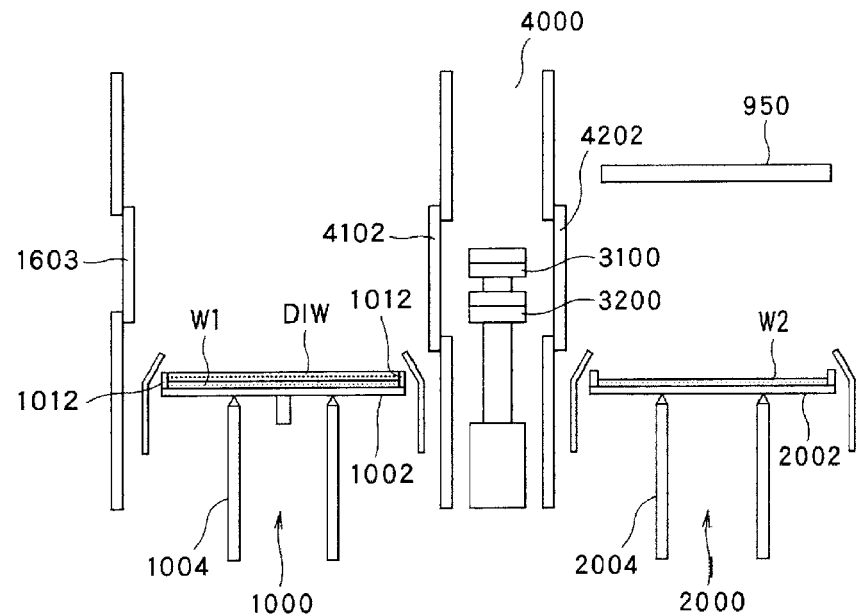
FIG. 15K is a schematic diagram for explaining the sequence of operations of the liquid processing module.

While the wafer W1 is delivered from the second arm 3200 to the first spin chuck 1002, the wafer W2 is delivered from the first arm 3100 to the second spin chuck 2002. The sequence of the delivery of the wafer W2 from the first arm 3100 to the second spin chuck 2002 is identical to the sequence of the delivery of the wafer W1 from the first arm 3100 to the second spin chuck 2002 described above with reference to FIG. 15C, and redundant description will be omitted. In this process, the first arm 3100 is also retreated into the arm standby space 4000 and the shutters 4102 and 4202 are closed, as illustrated in FIG. 15K.

In order to suppress cross-contamination between the first liquid processing device 1000 and the second liquid processing device 2000, it is desirable to open the shutters 4102 and 4202 for a time period as short as possible. To do so, it is desirable to perform a movement of the wafer W1 from the first liquid processing device 1000 to the second liquid processing device 2000 by the first arm 3100 and a movement of the wafer W2 from the second liquid processing device 2000 to the first liquid processing device 1000 by the second arm 3200 substantially simultaneously. In other words, it is desirable to exchange the wafer W1 and the wafer W2 substantially simultaneously.

However, typically, the time required to perform a series of liquid processings (post-liquid processing, referred to as liquid processing A) in the first liquid processing device 1000 is not identical to the time required to perform a series of liquid processings (pre-liquid processing, referred to as liquid processing B) in the second liquid processing device 2000. To exchange the wafer W1 and the wafer W2 substantially simultaneously in this circumstance, among the processes included in the liquid processing performed in a short time, a process, which does not substantially affect the processing result, may be performed for a long time.

For example, the wafer W may be left for some time in a state where no processing liquid is supplied onto the surface of the wafer W. Specifically, for example, if the time required for the liquid processing performed in the second liquid processing device 2000 is short, the wafer W2 is left in a state as shown on the right of FIG. 15K (state right after the non-processed wafer W2 is completely carried into the second liquid processing device 2000) or a state right after the lift pins 2004 receives the wafer W2 from the first arm 3100. Then, at a time point when the liquid processing has been performed in the first liquid processing device 1000 for some extent, the liquid processing can be started in the second liquid processing device 2000.

Otherwise, the time required for the liquid processing A may be made identical to the time required for the liquid processing B by increasing the time required for a final process included in the liquid processing performed in a short time, e.g., increasing the time required for a DIW rinse process, or increasing the leaving time in a state where a puddle of DIW has been formed on the surface of the wafer W. The time required for the DIW rinse process or the leaving time in a state where a puddle of DIW has been formed does not substantially affect the processing result as long as it is the same for all the wafers W.

Then, as illustrated in FIG. 15L to FIG. 15O, the liquid processing of the wafer W1 in the first liquid processing device 1000 is performed simultaneously with the liquid processing of the wafer W2 in the second liquid processing device 2000. The liquid processing of the wafer W2 in the second liquid processing device 2000 illustrated in FIG. 15L to FIG. 15O is identical to the liquid processing of the wafer W1 in the second liquid processing device 2000 illustrated in FIG. 15D to FIG. 15G, and redundant description will be omitted.

Here, the shutters 4102 and 4202 are closed, and, thus, there is no concern that cross-contamination occurs between the first liquid processing device 1000 and the second liquid processing device 2000. Further, the first arm 3100 and the second arm 3200 are retreated into the arm standby space 4000, and, thus, the first arm 3100 and the second arm 3200 are not contaminated by the atmospheres inside the first liquid processing device 1000 and the second liquid processing device 2000.

The liquid processing of the wafer W1 in the first liquid processing device 1000 will be described. The first spin chuck 1002 configured to hold the wafer W horizontally in the first liquid processing device 1000 rotates the wafer W around the vertical axis line. The nozzle 1034 is located right above a central portion of the wafer W1 being rotated and supplies a chemical liquid (e.g., chemical liquid different from the chemical liquid used in the second liquid processing device) to the wafer W1. The supplied chemical liquid flows toward a peripheral portion of the surface (top surface) of the wafer W1 and is scattered to the outside of the wafer W1 by a centrifugal force. Here, the entire surface of the wafer W1 is covered by a liquid film of the chemical liquid. This state is kept for a predetermined time period to perform a chemical liquid processing on the surface of the wafer W1 (see FIG. 15I).

When the chemical liquid processing is completed, the discharge of the chemical liquid from the nozzle 1034 is stopped and the rinse liquid DIW is supplied to the central portion of the wafer W1 being rotated from the nozzle 1034 (or another nozzle). The chemical liquid and reaction products remaining on the wafer W1 are washed off by the supplied rinse liquid. That is, the rinse processing is performed on the surface of the wafer W1 (see FIG. 15M).

Figure 15L:
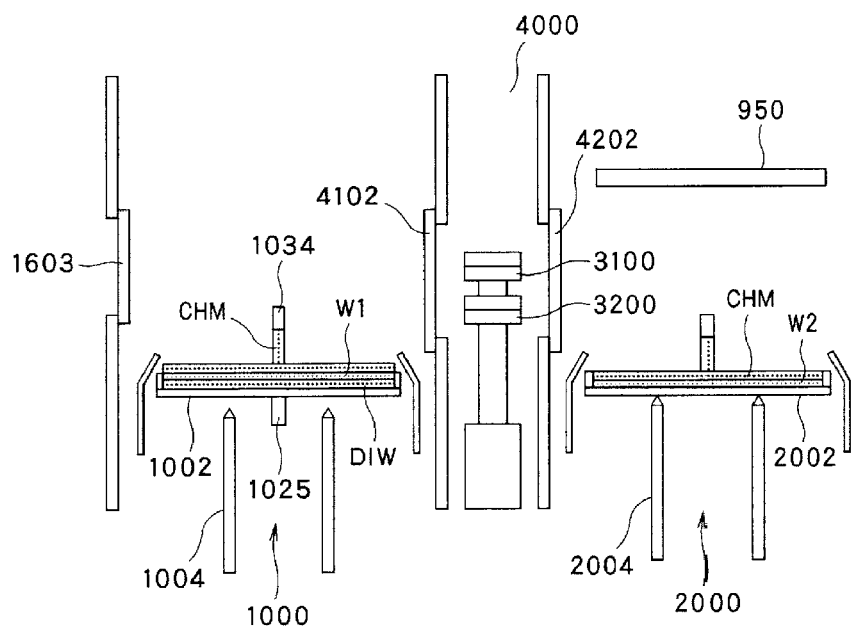
FIG. 15L is a schematic diagram for explaining the sequence of operations of the liquid processing module.
Figure 15M:
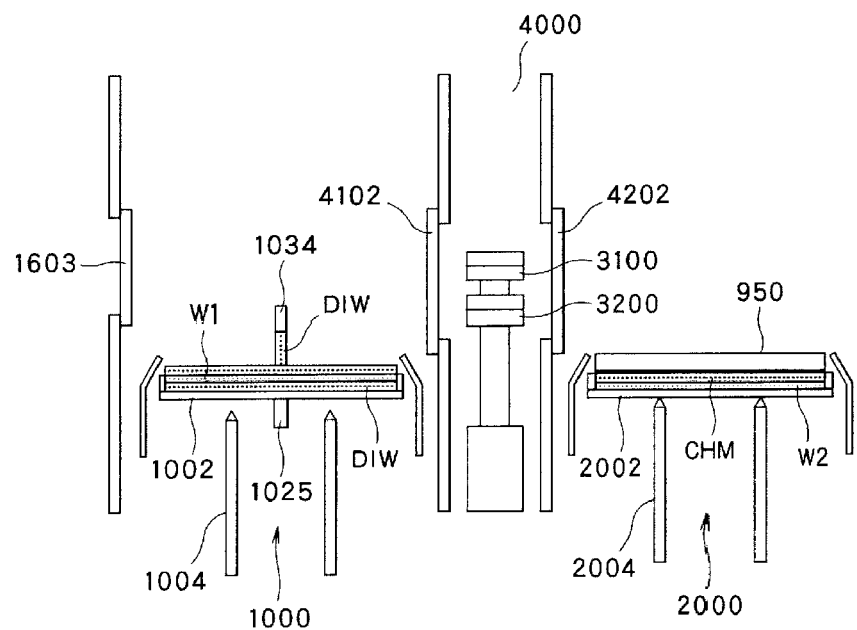
FIG. 15M is a schematic diagram for explaining the sequence of operations of the liquid processing module.

While the chemical liquid processing and the rinse processing are performed on the surface of the wafer W1, a rear surface (bottom surface) of the wafer W1 may be cleaned, as illustrated in FIG. 15L and FIG. 15M. The rear surface of the wafer W1 may be cleaned, for example, by discharging the rinse liquid DIW from a top end portion (bottom nozzle) of the processing fluid supply member 1025. The rinse liquid supplied from the bottom nozzle to a central portion of the rear surface of the wafer W1 flows toward a peripheral portion of the surface of the wafer W1 and is scattered to the outside of the wafer W1 by a centrifugal force. Here, the entire rear surface of the wafer W1 is covered by a liquid film of the rinse liquid, and particles adhering to the rear surface of the wafer W1 are washed off by the rinse liquid flowing on the rear surface of the wafer W1. Since the rear surface of the wafer W1 is covered by the liquid film of the rinse liquid, it is possible to suppress adhering of the processing liquids (chemical liquid and rinse liquid) used to process the surface of the wafer W1 to the rear surface of the wafer W1.

The same liquid processing as performed on the surface of the wafer W1 may be performed on the rear surface of the wafer W1. That is, while the chemical liquid processing is performed on the surface of the wafer W1, the chemical liquid processing may be performed on the rear surface of the wafer W1, and while the rinse processing is performed on the surface of the wafer W1, the rinse processing may be performed on the rear surface of the wafer W1. Further, in this case, a chemical liquid supply mechanism configured to supply a chemical liquid to the processing fluid supply path 1026 of the processing fluid supply member 1025 or another processing fluid supply path (not illustrated) is provided.

When the rinse processing on the surface of the wafer W1 is completed, the discharge of the rinse liquid from the nozzle 1034 is stopped. Slightly before the discharge of the rinse liquid is stopped, the discharge of IPA (drying liquid) toward the central portion of the surface of the wafer W1 from the nozzle 1036 is started. After the discharge of the rinse liquid from the nozzle 1034 is stopped, the discharge of IPA toward the central portion of the surface of the wafer W1 from the nozzle 1036 is continued. Thus, the rinse liquid DIW remaining on the surface of the wafer W1 is replaced with the IPA. When the replacement of IPA is sufficiently performed, the nozzle 1036 is moved to shift a liquid landing position of the IPA on the surface of the wafer W1 to the periphery of the wafer W1. Here, a circular dry region (dry core) is formed at the central portion of the surface of the wafer W1. Then, along with the movement of the nozzle 1036, the dry core is spread to the periphery of the wafer W1, and, thus, the entire surface of the wafer W1 is dried.

When the nozzle 1036 starts to move, the nozzle 1038 is located right above the central portion of the wafer W1 and the discharge of a nitrogen gas (drying gas) toward the central portion of the wafer W1 is started. Then, by moving the nozzle 1038, a discharge position (corresponding to an intersection portion between an axis line of a discharge opening of the nozzle 1038 and the wafer W1) of the nitrogen gas on the surface of the wafer W1 is shifted to the periphery of the wafer W1. While the distance between the IPA landing position and the rotation center of the wafer W1 is kept greater than the distance between the discharge position of the nitrogen gas and the rotation center of the wafer W1, the nozzles 1036 and 1038 are moved (see FIG. 15N). Accordingly, it is possible to promote the drying of the IPA and reduce the generation of particles.

Figure 15N:
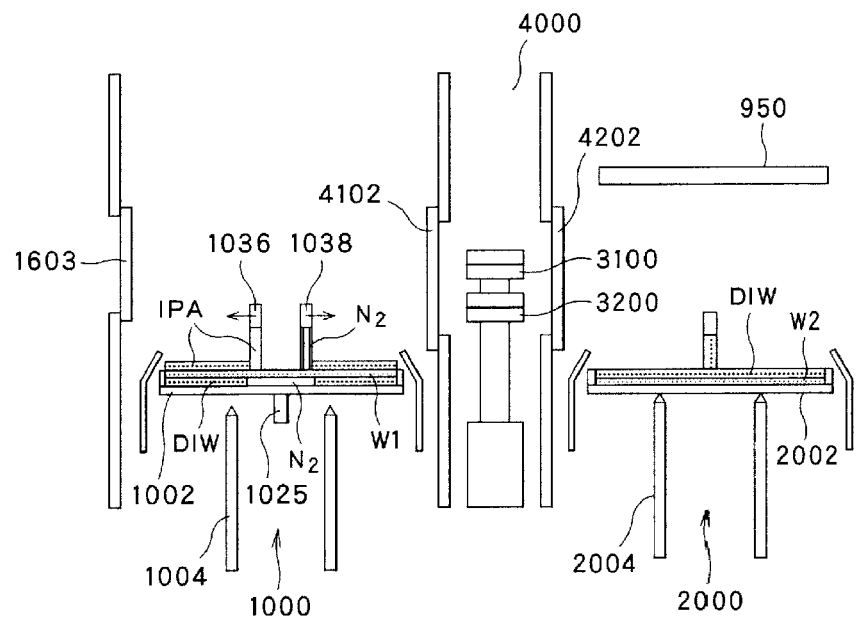
FIG. 15N is a schematic diagram for explaining the sequence of operations of the liquid processing module.

As illustrated in FIG. 15N, while the surface of the wafer W1 is dried using the IPA and the nitrogen gas as described above, the rear surface (bottom surface) of the wafer W1 is dried. The rear surface of the wafer W1 is dried by supplying a nitrogen gas while stopping the supply of the rinse liquid from the top end portion (bottom nozzle) of the processing fluid supply member 1025. That is, a scattering and drying processing is performed to the rear surface of the wafer W1.

By supplying the nitrogen gas from the bottom nozzle, the drying can be promoted and the generation of particles can be reduced.

Figure 15O:
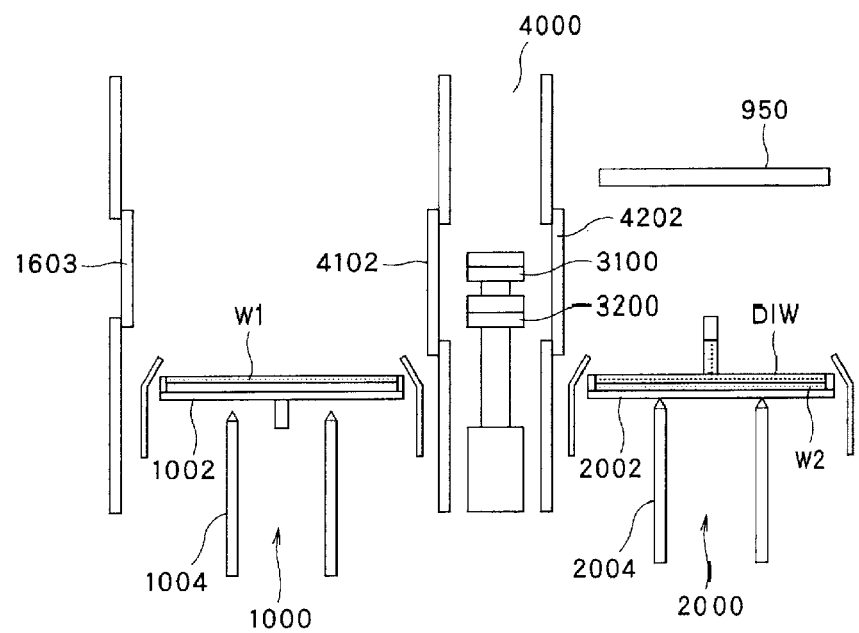
FIG. 15O is a schematic diagram for explaining the sequence of operations of the liquid processing module.

FIG. 15O illustrates a state right after the liquid processing on the wafer W1 in the first liquid processing device 1000 is completed. The state of the second liquid processing device 2000 illustrated in FIG. 15O is the same as illustrated in FIG. 15F.

Figure 15P:
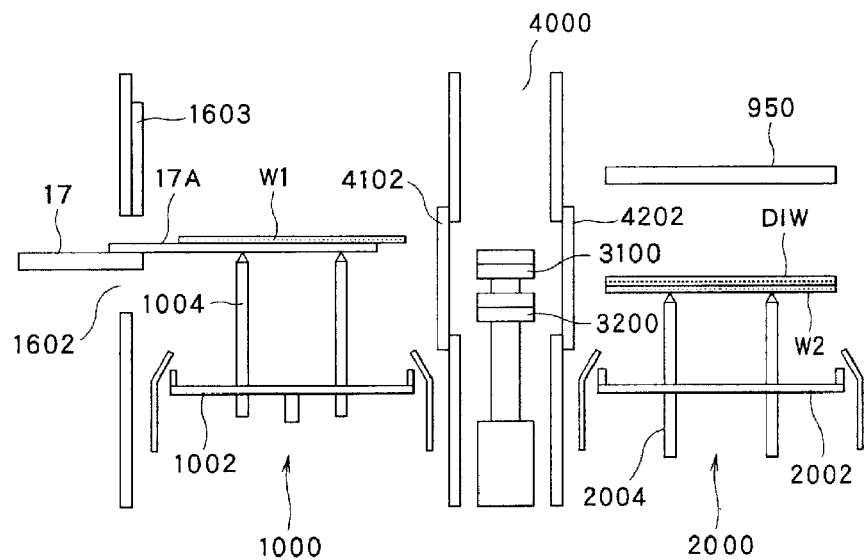
FIG. 15P is a schematic diagram for explaining the sequence of operations of the liquid processing module.

Then, as illustrated in FIG. 15P, in the first liquid processing device 1000, the lift pins 1004 raise up the wafer W1 to a suitable position for delivery to the transfer arm 17A and the shutter 1603 is opened. Thereafter, the empty transfer arm 17A enters into the first liquid processing device 1000 and receives the wafer W1 from the lift pins 1004 and then is retreated from the first liquid processing device 1000. Then, as illustrated in FIG. 15Q, the transfer arm 17A holding a third wafer W3 enters into the first liquid processing device 1000 and delivers the wafer W3 to the lift pins 1004 and then is retreated from the first liquid processing device 1000. Then, the shutter 1603 is closed.

In an appropriate exemplary embodiment, the substrate transfer device 17 is equipped with two transfer arms 17A and the wafer W1 is carried out and the wafer W3 is carried in by a pick and place operation. That is, in a state where one of the transfer arms 17A holds the wafer W3 and the other transfer arm 17A is empty, the substrate transfer device 17 is placed to face the liquid processing module 16. Then, only the transfer arms of the substrate transfer device 17 are moved without moving a base portion of the substrate transfer device 17, so that the carry-out of the wafer W1 and the carry-in of the wafer W3 are sequentially performed. However, the substrate transfer device 17 may be equipped with only one transfer arm 17A.

Figure 15Q:
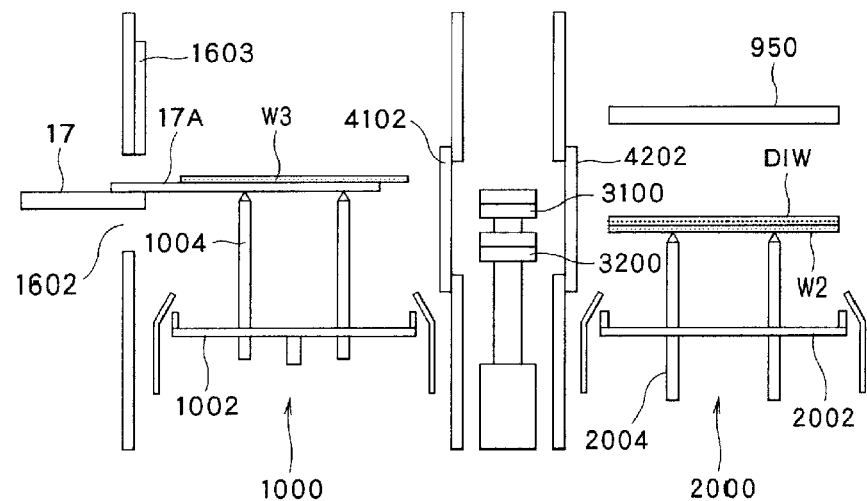
FIG. 15Q is a schematic diagram for explaining the sequence of operations of the liquid processing module.

The state illustrated in FIG. 15Q is completely identical to the state illustrated in FIG. 15H except that the wafer W2 is exchanged with the wafer W3 and the wafer W1 is exchanged with the wafer W2. Therefore, after the liquid processing module 16 is put in the state illustrated in FIG. 15Q, the operations illustrated in FIG. 15J to FIG. 15O are repeated until all the wafers W included in a single processing lot are completely processed.

Then, the operations performed by the second rotational liquid processing unit 2001 until the state illustrated in FIG. 15C is changed to the state illustrated in FIG. 15H will be described with reference to FIG. 6.

[Carry-in of Wafer W to Second Liquid Processing Device]

The first arm 3100 locates a wafer W right above the rotatable table 100 (see FIG. 6) serving as the second spin chuck 2002 and delivers the wafer W to the lift pins 211 (see FIG. 6) corresponding to the lift pins 2004 illustrated in FIG. 15C by the method described above with reference to FIG. 15C. While the lift pins 211 are moved to the processing position, the wafer W is loaded onto the top surface 120A of the suction plate 120. The constituent elements in the following descriptions are illustrated in FIG. 6.

Then, the suction device 154 operates so that the suction plate 120 is suctioned onto the hot plate 140 and the wafer W is also suctioned onto the suction plate 120. Thereafter, the wafer sensor 860 starts to inspect whether the wafer W has been appropriately suctioned onto the suction plate 120.

A purge gas (e.g., $N_2$ gas) is continuously supplied to the outermost recess region 125G on the top surface of the suction plate 120 from the purge gas supply device 155. Thus, even if there is a gap at a contact surface between a peripheral portion of a bottom surface of the wafer W and a peripheral portion of the suction plate 120, a processing liquid cannot be introduced between the peripheral portion of the wafer W and the peripheral portion of the suction plate 120 through the gap.

Before the carry-in of the wafer W to the second liquid processing device 2000 (liquid processing unit illustrated in FIG. 6) is started, the second electrode unit 161B is located at the ascending position and the plurality of first electrodes 164A of the first electrode unit 161A is in contact with the plurality of second electrodes 164B of the second electrode unit 161B. Since electric power is supplied from the power supply 300 to the heater 142 of the hot plate 140, the heater 142 of the hot plate 140 is preliminarily heated. Also, the hot plate 140 is heated by the auxiliary heater 900 that is constantly supplied with electric power.

In an exemplary embodiment, electric power supplied to the heater (main heater) 142 through the switch mechanism 160 is greater than electric power supplied to the auxiliary heater 900 through the power transmission mechanisms 910 and 920 illustrated in FIG. 14A to FIG. 14C and the power transmission mechanisms 902 and 903 illustrated in FIG. 6. That is, the auxiliary heater 900 primarily functions to suppress a decrease in temperature of the hot plate 140 when heating cannot be performed by the heater 142. However, the amount of heat generated by the auxiliary heater 900 may be substantially identical to the amount of heat generated by the heater 142.

[Wafer Heating]

When the wafer W is suctioned onto the suction plate 120, the supply of electric power to the heater 142 of the hot plate 140 is controlled so that the temperature of the hot plate 140 can be increased to a predetermined temperature (suitable for a subsequent processing of the wafer W on the suction plate 120).

[Chemical Liquid Processing]

Then, the chemical liquid nozzle 701 is located right above the central portion of the wafer W by a nozzle arm of the processing liquid supply 700. In this state, a temperature controlled chemical liquid is supplied to the surface (top surface) of the wafer W from the chemical liquid nozzle 701. The supply of the chemical liquid continues until a liquid surface LS of the chemical liquid is located higher than the top surface of the wafer W. Here, the upper part 181 of the periphery cover body 180 serves as a bank for suppressing the overflow of the chemical liquid to the outside of the rotatable table 100. This state approximately corresponds to the state illustrated in FIG. 15D.

When a puddle of the chemical liquid is formed on the surface of the wafer W, the chemical liquid nozzle 701 is retreated from above the surface of the wafer W and then, the top plate 950, at least the bottom surface of which has been heated by the heater 952, is close to the surface of the chemical liquid puddle on the wafer W and located at the cover position where the top plate 950 covers the surface of the wafer W (as illustrated only in FIG. 15E).

Here, the top plate 950 may not have been heated by the heater 952 and just needs to be close to the surface of the chemical liquid puddle. In this case, it is possible to suppress contamination in the second liquid processing device 2000 caused by, for example, scattering of chemical liquid components. In this case, the top plate 950 may not be equipped with the heater 952. Here, a heated inert gas such as a hot $N_2$ gas (heated nitrogen gas) may be supplied through the temperature control gas nozzle 980. Also, instead of the hot $N_2$ gas, an inert gas such as a non-heated $N_2$ gas may be supplied.

During or after the supply of the chemical liquid, the rotatable table 100 is rotated (e.g., about 180°) at a low speed alternately in a forward rotation direction and a reverse rotation direction. Thus, the chemical liquid is stirred and a reaction between the surface of the wafer W and the chemical liquid can occur uniformly in the surface of the wafer W.

In general, the temperature of a peripheral portion of a wafer W tends to decrease due to the effect of air flow introduced into a liquid recovery cup. The supply of electric power to the heater elements 142E for heating the peripheral portion (heating zones 143-1 to 143-4 illustrated in FIG. 3) of the wafer W among the plurality of heater elements 142E of the heater 142 may be increased. Thus, the temperature of the wafer W becomes uniform in the surface of the wafer W, and a reaction between the surface of the wafer W and the chemical liquid can occur uniformly in the surface of the wafer W.

During the chemical liquid processing, the supply of electric power to the heater 142 may be controlled based on detection values of a temperature sensor 146 provided in the hot plate 140. Otherwise, the supply of electric power to the heater 142 may be controlled based on detection values of the infrared thermometers 870 configured to detect the surface temperature of the wafer W. When the detection values of the infrared thermometers 870 are used, it is possible to more accurately control the temperature of the wafer W. The supply of electric power to the heater 142 may be controlled based on the detection values of the temperature sensor 146 in the former half of the chemical liquid processing and based on the detection values of the infrared thermometers 870 in the latter half of the chemical liquid processing.

In an exemplary embodiment, while the liquid processing module 16 (substrate processing system 1) is driven, the supply of electric power to the auxiliary heater 900 is kept constant and the temperature of the wafer W is controlled by controlling the supply of electric power to the heater 142. However, the supply of electric power to the auxiliary heater 900 may be controlled to make the auxiliary heater 900 involved in controlling the temperature of the wafer W.

[Removal of Chemical Liquid]

When the chemical liquid processing is ended, the supply of electric power to the heater 142 from the power supply 300 is first stopped. Then, the second electrode unit 161B is moved down to the descending position. By stopping the supply of electric power first, it is possible to suppress the generation of sparks between the electrodes when the second electrode unit 161B is moved down.

Then, the top plate 950 is retreated to the standby position. This state is illustrated only in FIG. 15F.

Then, the rotatable table 100 is rotated at a high speed to scatter the chemical liquid on the wafer W to the outside by a centrifugal force. Since the inner peripheral surface 185 of the upper part 181 of the periphery cover body 180 is inclined, all the chemical liquid (including the chemical liquid on the wafer W) present on an inner side in the radial direction relative to the upper part 181 can be smoothly removed. The scattered chemical liquid flows down through the path 190 between the rotary cup 188 and the periphery cover body 180 and is collected into the liquid recovery cup 800. Here, the first and second movable cup elements 802 and 803 are respectively located at suitable positions to guide the scattered chemical liquid to an appropriate drain path (any one of the first drain path 806, the second drain path 807 and the third drain path 808) depending on the kind of chemical liquid.

[Rinse]

Then, the rotatable table 100 is rotated at a low speed and the rinse liquid nozzle 702 is located right above the central portion of the wafer W to supply a rinse (e.g., DIW) from the rinse nozzle 702. Thus, all the chemical liquid (including the chemical liquid remaining on the wafer W) remaining on an inner side in the radial direction relative to the upper part 181 of the periphery cover body 180 can be washed off by the rinse liquid.

The rinse liquid supplied from the rinse nozzle 702 may be a rinse liquid of a room-temperature or a heated rinse liquid. If the heated rinse liquid is supplied, it is possible to suppress a decrease in temperature of the suction plate 120 and the hot plate 140. The heated rinse liquid may be supplied from a factory power supply system. Otherwise, to heat the rinse liquid of the room-temperature, a heater (not illustrated) may be provided in the rinse liquid supply line connecting the rinse liquid source 702A and the rinse nozzle 702.

Then, while the supply of the rinse liquid from the rinse nozzle 702 continues, the rotation speed of the rotatable table 100 decreases to finally stop the rotation of the rotatable table 100. This state is illustrated in FIG. 15G. Then, the supply of the rinse liquid from the rinse nozzle 702 is stopped. Thus, a puddle of the rinse liquid is formed on the surface of the wafer W.

[Carry-Out of Wafer from Second Liquid Processing Device]

Then, the switch device (three-way valve) 156 is switched to change a connection destination of the suction pipe 153W from the suction device 154 to the purge gas supply device 155. Thus, a purge gas is supplied to the plate bottom surface suction path groove 121P and also supplied to the recess regions 125W of the top surface 120A of the suction plate 120 through the substrate bottom surface suction path groove 121W. Thus, the suction of the wafer W onto the suction plate 120 is released.

Along with the above-described operation, the suction of the suction plate 120 onto the hot plate 140 is also released. It is not necessary to release the suction of the suction plate 120 onto the hot plate 140 whenever a processing on each wafer W is ended. Thus, any pipe system where suction release is not performed may be used.

Then, the lift pins 211 is moved up to the delivery position. This state is illustrated in FIG. 15H. Since the suction of the wafer W onto the suction plate 120 has been released by the purge, the wafer W can be easily separated from the suction plate 120. For this reason, it is possible to suppress scratches on the wafer W.

Then, the wafer W loaded on the lift pins 211 is delivered to the second arm 3200. This state is illustrated in FIG. 15I. Thereafter, the wafer sensor 860 checks whether the wafer W is present on the suction plate 120. As such, a series of the processings on the single wafer W is ended.

The chemical liquid used in the second liquid processing device 2000 may be, for example, SC1, sulfuric acid and hydrogen peroxide mixture (SPM), phosphoric acid aqueous solution ($H_3PO_4$) or the like. For example, the temperature of SC1 is in the range of from room temperature to 70° C., the temperature of SPM is in the range of from 100° C. to 120° C. and the temperature of $H_3PO_4$ is in the range of from 100° C. to 165° C. The chemical liquid used in the first liquid processing device 1000 may be, for example, SC1, DHF or the like. For example, the temperature of SC1 is in the range of from room temperature to 70° C. and the temperature of DHF is in the range of from 20° C. to 25° C.

Figure 16A:
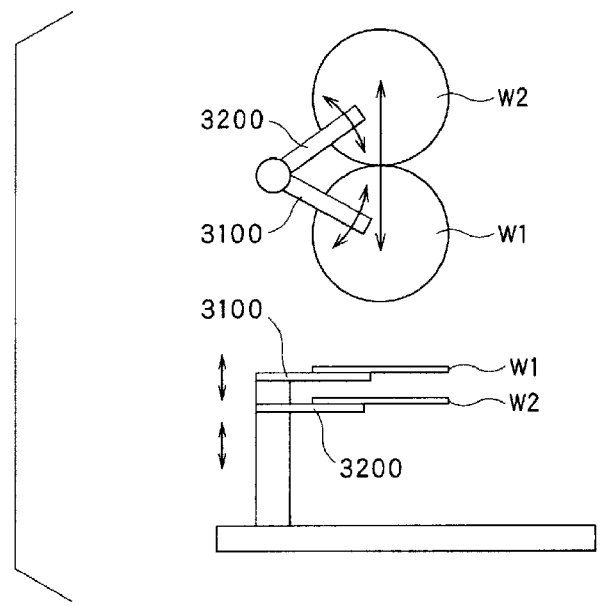
FIG. 16A illustrates a modification example of a first arm and a second arm provided in the liquid processing module.
Figure 16B:
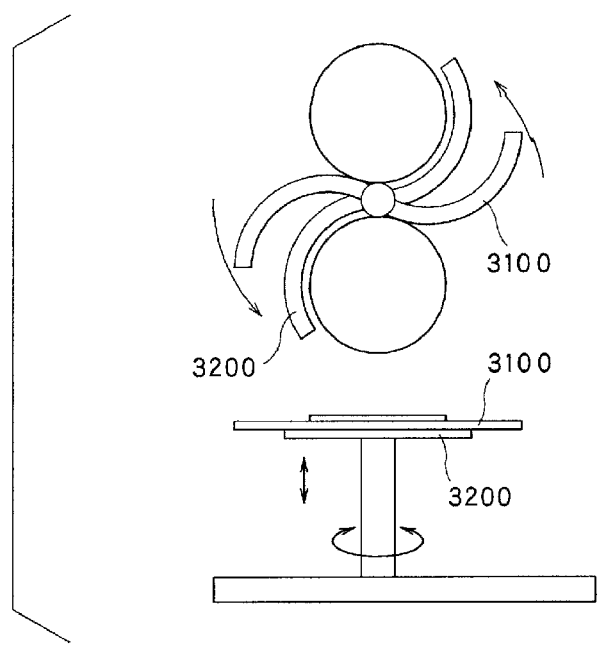
FIG. 16B illustrates another modification example of the first arm and the second arm provided in the liquid processing module.

A configuration of the first arm 3100 and the second arm 3200 is not limited to the above descriptions and may have the configurations as illustrated in FIG. 16A and FIG. 16B. In FIG. 16A and FIG. 16B, an upper part is a schematic plan view of the first arm 3100 and the second arm 3200 and a lower part is a schematic side view of these arms.

In a modification example illustrated in FIG. 16A, the first arm 3100 and the second arm 3200 are configured to be rotated around the same rotation axis line when viewed from the top. The first arm 3100 and the second arm 3200 are located at different height positions as in the above-described exemplary embodiment.

In a modification example illustrated in FIG. 16B, the first arm 3100 and the second arm 3200 are located at the same height position. The first arm 3100 and the second arm 3200 are configured to be rotated around the same rotation axis line when viewed from the top. The first arm 3100 and the second arm 3200 are placed in a point symmetry with respect to the rotation axis line.

According to the above-described exemplary embodiment, a series of liquid processings including the liquid processing A and the liquid processing B that are sequentially performed to a single wafer W can be performed with high efficiency. That is, while a puddle is formed on a surface of the wafer W in the second liquid processing device and the liquid processing A is performed on the wafer W that is not substantially rotated, hardware resources such as a nozzle and a rotary motor of a spin chuck are wasted in an inactive state. According to the above-described exemplary embodiment, while the liquid processing A is performed in the second liquid processing device, the liquid processing B can be performed in the first liquid processing device. It is possible to perform the series of liquid processings with high efficiency and improve the throughput of the entire substrate processing system. Also, a substantial operation rate of the device including the first liquid processing device and the second liquid processing device can be improved, and, thus, the hardware resources can be efficiently used.

The above-described effect can be achieved to some extent just by using a first processing module configured to perform the liquid processing A only and a second processing module configured to perform the liquid processing B only. However, if the first processing module and the second processing module are individual modules separated from each other, it takes effort and time to perform transfer between the processing modules, and, thus, actually, it is impossible to sufficiently improve the throughput. However, in the above-described exemplary embodiment, two wafers are exchanged substantially simultaneously by the first arm 3100 and the second arm 3200, and, thus, it is possible to greatly reduce the time required to transfer wafers between the first liquid processing device 1000 and the second liquid processing device 2000.

The exemplary embodiments disclosed herein are illustrative in all aspects and not limited thereto. Further, the above-described exemplary embodiments may be omitted, substituted, or changed in various forms without departing from the scope of the appended claims.

The substrate to be processed is not limited to the semiconductor wafer and may be another substrate, such as a glass substrate or a ceramic substrate, used in manufacturing a semiconductor device.

According to the exemplary embodiments, it is possible to perform the liquid processing including various kinds of liquid processes on a substrate with high efficiency.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. A substrate processing apparatus, comprising:
a liquid processing module, including a carry-out/in port of a substrate, in which a first liquid processing device and a second liquid processing device provided at a position farther in a first horizontal direction from the carry-out/in port than the first liquid processing device are provided; and
a transfer device configured to carry the substrate out from and into the liquid processing module,
wherein the first liquid processing device is equipped with a first holder configured to hold the substrate and configured to perform a first liquid processing on the substrate held by the first holder,
the second liquid processing device is equipped with a second holder configured to hold the substrate and configured to perform a second liquid processing on the substrate held by the second holder before or after the first liquid processing, and
the transfer device is equipped with a substrate holder configured to be moved back and forth in the first horizontal direction, and is configured to carry the substrate, which is to be processed in the first liquid processing device and the second liquid processing device, into the first liquid processing device through the carry-out/in port and carry the substrate, which is processed in the first liquid processing device and the second liquid processing device, out from the first liquid processing device through the carry-out/in port by moving the substrate held by the substrate holder back and forth in the first horizontal direction,
wherein the liquid processing module further includes:
at least one partition wall configured to isolate an atmosphere inside the first liquid processing device from an atmosphere inside the second liquid processing device;
a shutter configured to open/close an opening provided in the partition wall; and
an exchange device, provided between the first liquid processing device and the second liquid processing device, configured to exchange the substrate between the first liquid processing device and the second liquid processing device through the opening,
wherein the carry-out/in port, the first liquid processing device, the opening and the second liquid processing device are arranged in the first horizontal direction, and
the carry-out/in port and the opening are overlapped with each other at least in part when viewed from the first horizontal direction.

2. The substrate processing apparatus of claim 1,
wherein the exchange device includes a first arm and a second arm, and is configured to perform the exchange of the substrate by a transfer of a first substrate from the first liquid processing device to the second liquid processing device through the first arm and a transfer of a second substrate from the second liquid processing device to the first liquid processing device through the second arm.

3. The substrate processing apparatus of claim 2,
wherein the first arm and the second arm are provided at different height positions from each other, which allows the transfer of the first substrate from the first liquid processing device to the second liquid processing device through the first arm and the transfer of the second substrate from the second liquid processing device to the first liquid processing device through the second arm to be performed simultaneously without interference between the first arm and the second arm.

4. The substrate processing apparatus of claim 2,
wherein the at least one partition wall includes a first partition wall provided near the first liquid processing device and a second partition wall provided near the second liquid processing device,
the opening and the shutter are provided at each of the first partition wall and the second partition wall, and
an arm standby space allowed to accommodate therein the first arm and the second arm is formed between the first partition wall and the second partition wall.

5. The substrate processing apparatus of claim 2, further comprising:
a controller configured to control an operation of at least the liquid processing module,
wherein the controller simultaneously performs the transfer of the first substrate from the first liquid processing device to the second liquid processing device through the first arm and the transfer of the second substrate from the second liquid processing device to the first liquid processing device through the second arm, and
when a time required for a liquid processing performed in the first liquid processing device is different from a time required for a liquid processing performed in the second liquid processing device, the controller performs, in any one liquid processing device where the liquid processing is performed in a shorter time, at least one of delaying a start of the liquid processing or increasing a time required for a final process of the liquid processing.

6. The substrate processing apparatus of claim 1,
wherein the liquid processing module further includes a first gas supply configured to supply a gas into the first liquid processing device; a first exhaust unit configured to exhaust the atmosphere inside the first liquid processing device; a second gas supply configured to supply a gas into the second liquid processing device; and a second exhaust unit configured to exhaust the atmosphere inside the second liquid processing device, and is configured to independently control a pressure inside the first liquid processing device and a pressure inside the second liquid processing device.

7. The substrate processing apparatus of claim 2, further comprising:
a controller configured to control an operation of at least the liquid processing module,
wherein the controller controls the operation of the liquid processing module such that a final process of a preceding liquid processing performed in one of the first liquid processing device and the second liquid processing device that performs the liquid processing on the substrate first is a puddle forming process in which a puddle of a processing liquid is formed on a front surface of the substrate and such that the substrate is transferred to the liquid processing device that performs a succeeding liquid processing performed after the preceding liquid processing in a state where the puddle of the processing liquid is formed thereon, and
the preceding liquid processing is a first one of the first liquid processing and the second liquid processing and the succeeding liquid processing is a second one of the first liquid processing and the second liquid processing.

8. The substrate processing apparatus of claim 7,
wherein when the substrate is transferred to the liquid processing device that performs the succeeding liquid processing performed after the preceding liquid processing in the state where the puddle of the processing liquid is formed thereon, one of the first arm and the second arm, which is located at a lower height position, is used.

9. The substrate processing apparatus of claim 7,
wherein the final process of the preceding liquid processing is the puddle forming process in which a puddle of a rinse liquid is formed on the front surface of the substrate, and
the preceding liquid processing further includes, before the puddle forming process, an etching process of wet-etching the substrate with a chemical liquid and a rinse process of rinsing the substrate with the rinse liquid after the etching process.

10. The substrate processing apparatus of claim 9,
wherein the etching process of the preceding liquid processing is performed in a state where the substrate is heated, and
a heater configured to heat the substrate is provided in one of the first liquid processing device and the second liquid processing device that performs the preceding liquid processing.

11. The substrate processing apparatus of claim 10,
wherein a temperature-controlled gas supply configured to supply a heated gas into the liquid processing device that performs the preceding liquid processing is provided.

12. The substrate processing apparatus of claim 7,
wherein the liquid processing device that performs the preceding liquid processing is the second liquid processing device.

13. The substrate processing apparatus of claim 7,
wherein a final process of the succeeding liquid processing is a drying process using a drying organic solvent and a drying gas.

14. The substrate processing apparatus of claim 13,
wherein one of the first holder and the second holder, that is provided in the liquid processing device which performs the succeeding liquid processing, is a mechanical chuck configured to grip a periphery of the substrate and hold the substrate horizontally, and
one of the first liquid processing device and the second liquid processing device, that is equipped with the mechanical chuck, is configured to perform the liquid processing on both the front surface and a rear surface of the substrate.

15. The substrate processing apparatus of claim 1, wherein the first liquid processing includes a first chemical liquid process using a first chemical liquid, and the second liquid processing includes a second chemical liquid process using a second chemical liquid different from the first chemical liquid.

* * * * *